(12) United States Patent
Zandbergen

(10) Patent No.: US 11,994,663 B2
(45) Date of Patent: May 28, 2024

(54) VACUUM TRANSFER ASSEMBLY

(71) Applicant: HENNYZ B.V., Katwijk (NL)

(72) Inventor: Hendrik Willem Zandbergen, Katwijk (NL)

(73) Assignee: HENNYZ B.V., Katwijk (NL)

( * ) Notice: Subject to any disclaimer, the term of this patent is extended or adjusted under 35 U.S.C. 154(b) by 906 days.

(21) Appl. No.: 16/960,287

(22) PCT Filed: Jan. 7, 2019

(86) PCT No.: PCT/NL2019/050005
§ 371 (c)(1),
(2) Date: Jul. 6, 2020

(87) PCT Pub. No.: WO2019/135679
PCT Pub. Date: Jul. 11, 2019

(65) Prior Publication Data
US 2021/0055534 A1    Feb. 25, 2021

(30) Foreign Application Priority Data

Jan. 5, 2018 (NL) .................................. 2020235

(51) Int. Cl.
*G02B 21/32* (2006.01)
*H01J 37/20* (2006.01)
(52) U.S. Cl.
CPC .............. *G02B 21/32* (2013.01); *H01J 37/20* (2013.01); *H01J 2237/2001* (2013.01); *H01J 2237/2004* (2013.01); *H01J 2237/204* (2013.01); *H01J 2237/2802* (2013.01)

(58) Field of Classification Search
CPC .. G02B 21/32; H01J 37/20; H01J 2237/2001; H01J 2237/2004; H01J 2237/204; H01J 2237/2802
See application file for complete search history.

(56) References Cited

U.S. PATENT DOCUMENTS

| | | | |
|---|---|---|---|
| 2009/0078060 A1 | 3/2009 | Moore et al. | |
| 2013/0168549 A1 | 7/2013 | Yamazaki | |
| 2015/0206703 A1* | 7/2015 | Kobayashi | H01J 37/26 250/311 |
| 2015/0243472 A1 | 8/2015 | Kikuchi et al. | |
| 2015/0340199 A1* | 11/2015 | Nagakubo | H01J 37/20 250/443.1 |
| 2016/0209288 A1* | 7/2016 | Kelly | G01L 19/0084 |
| 2016/0276126 A1 | 9/2016 | Zandbergen | |

FOREIGN PATENT DOCUMENTS

JP    S63 318051 A    12/1988

OTHER PUBLICATIONS

International Search Report and Written Opinion, dated Apr. 6, 2019, for International Application No. PCT/NL2019/050005, 15 pages.

* cited by examiner

*Primary Examiner* — Jennifer Bahls
*Assistant Examiner* — Quang X Nguyen
(74) *Attorney, Agent, or Firm* — Seed IP Law Group LLP

(57) ABSTRACT

The present invention is in the field of a vacuum transfer assembly, such as for cryotransfer, and specifically a TEM vacuum transfer assembly, which can be used in microscopy, a sample holder, a vacuum housing, a sample holder stage and a sample holder coupling unit for use in the assembly, and a microscope comprising said assembly as well as a method of vacuum transfer into a microscope.

13 Claims, 17 Drawing Sheets

Figure 1A:
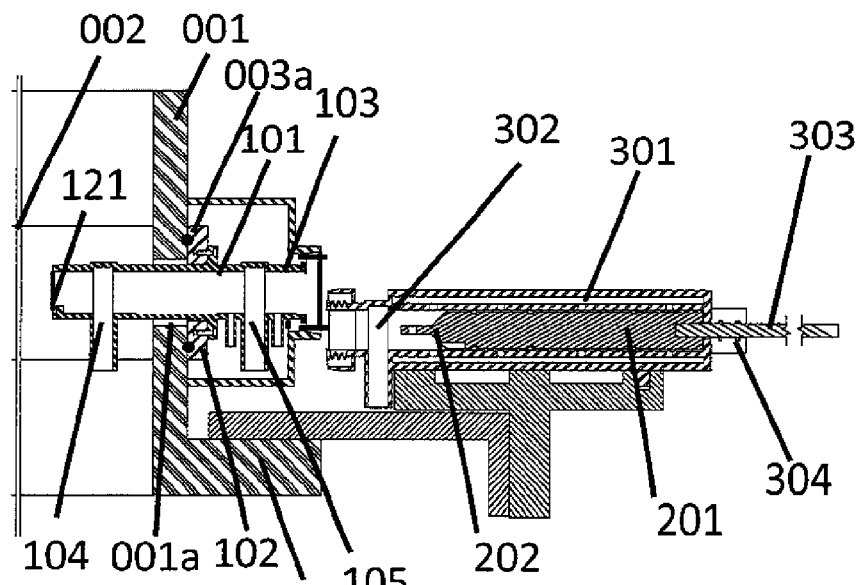
Figure 1B:
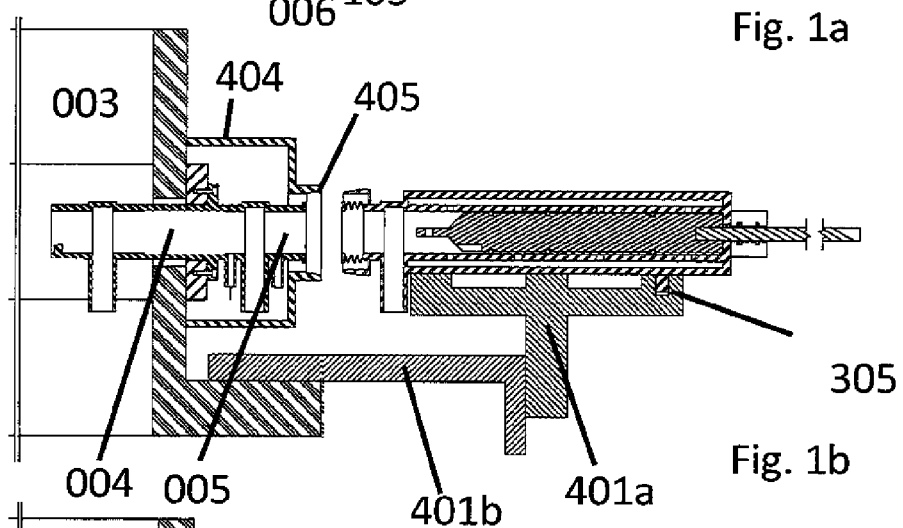
Figure 1C:
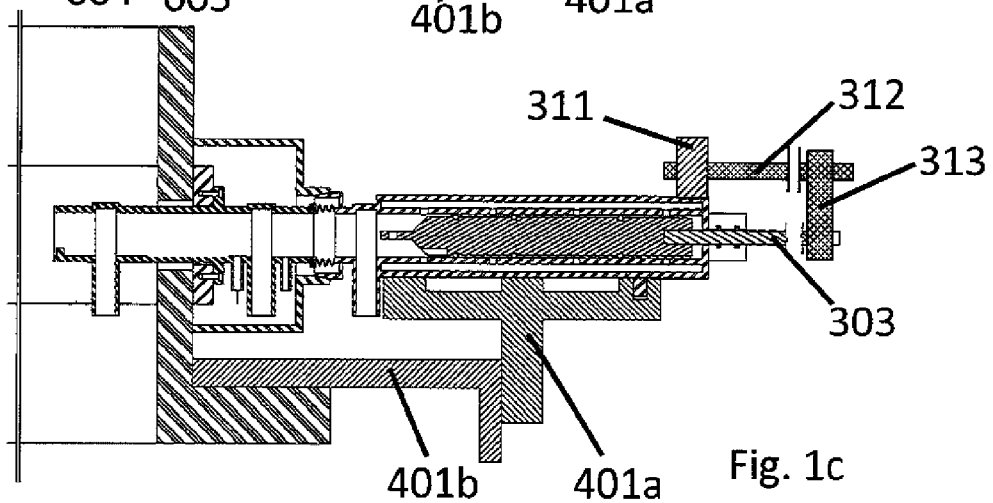
Figure 1D:
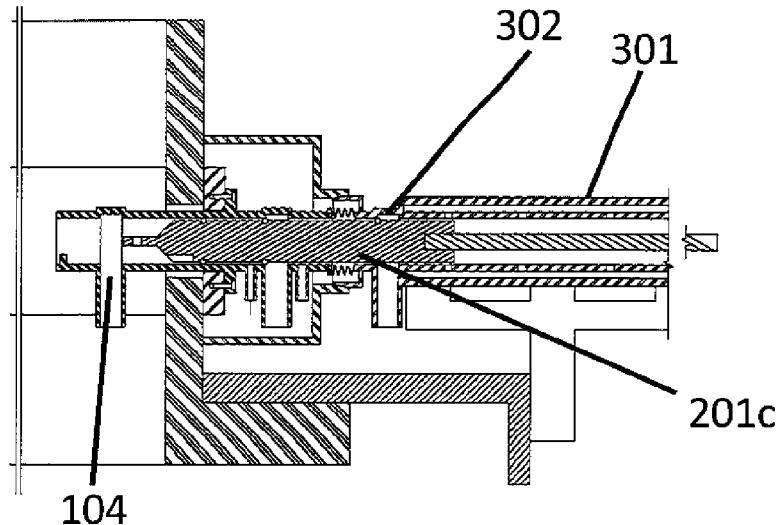
Figure 1E:
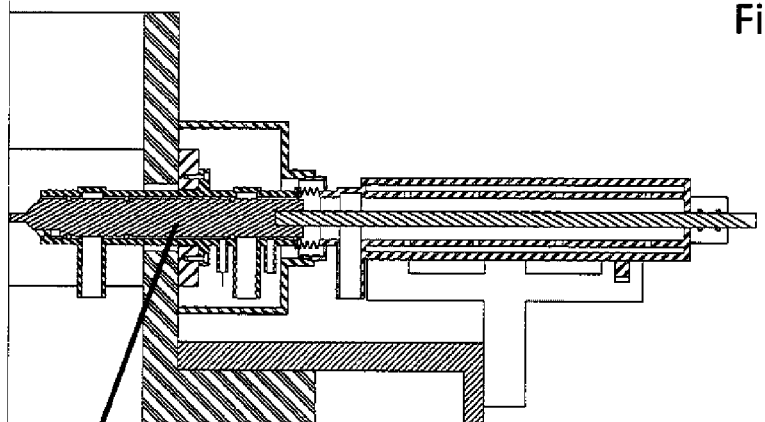
Figure 1F:
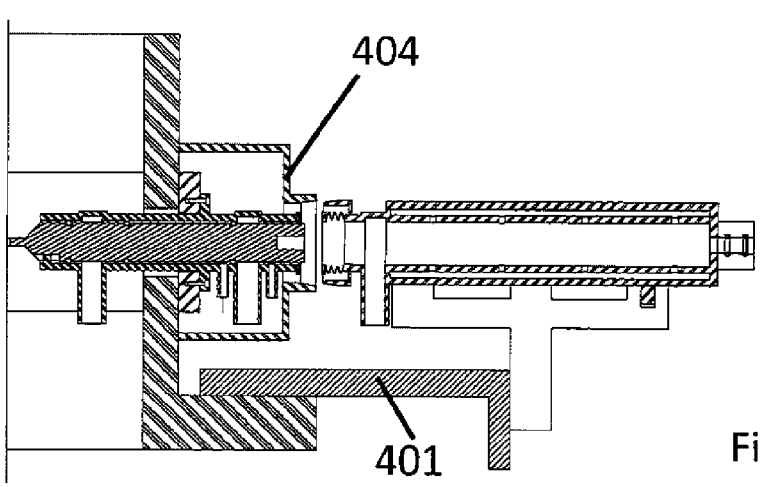
Figure 2A:
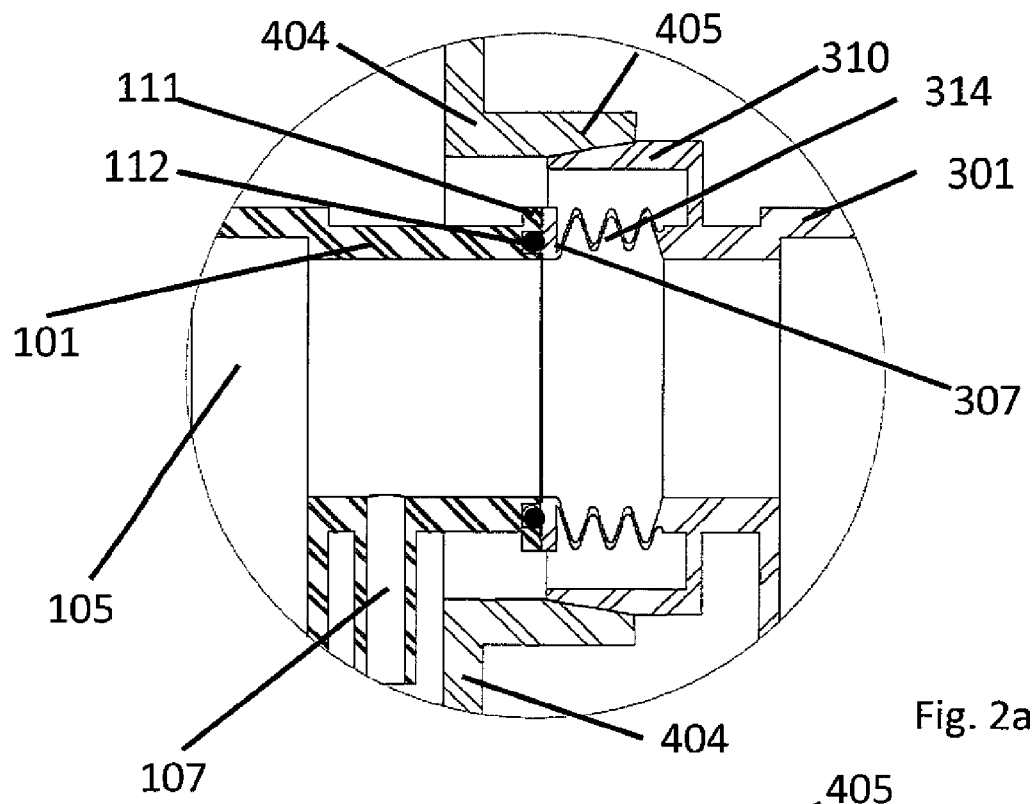
Figure 2B:
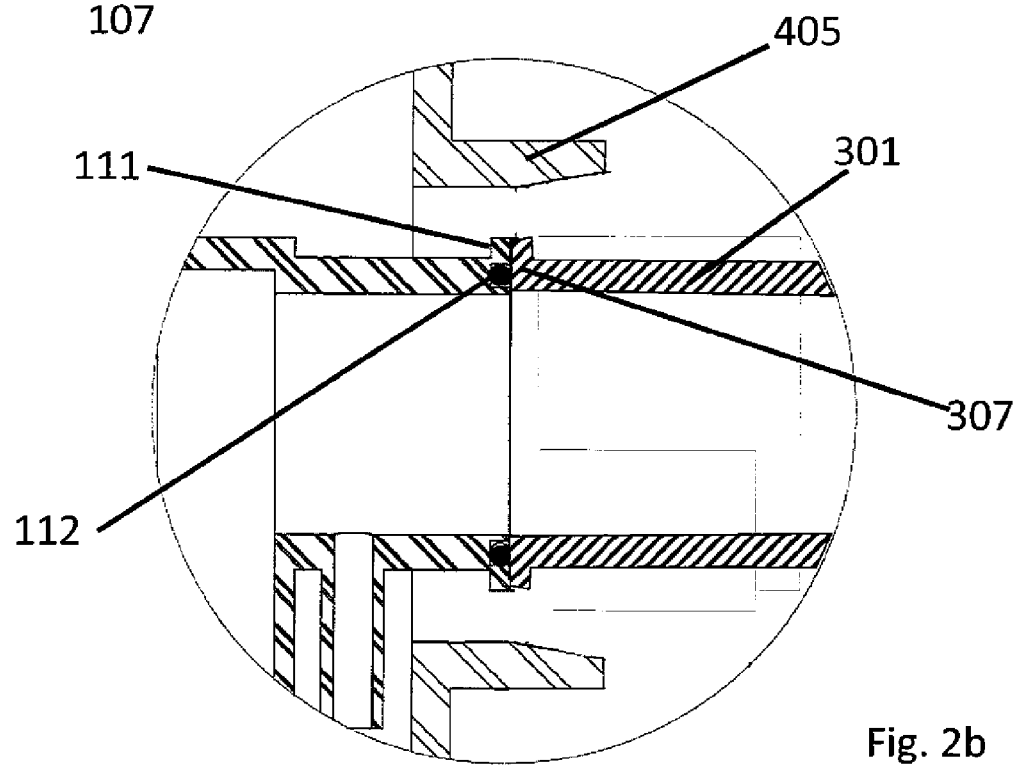
Figure 2C:
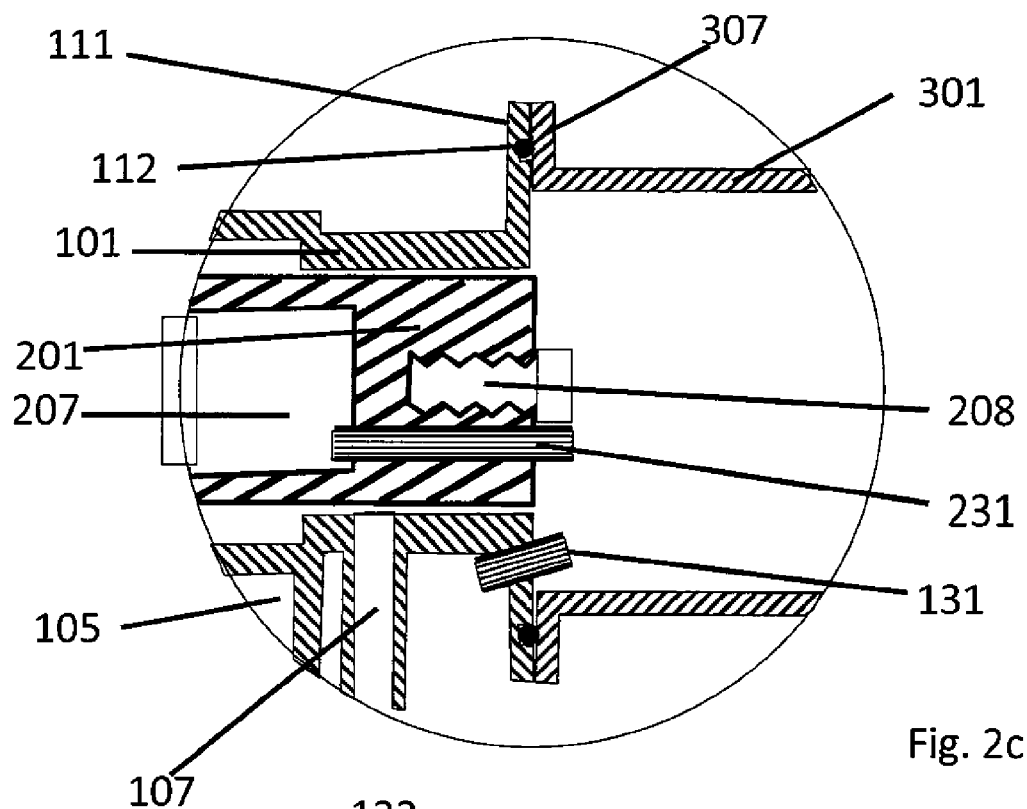
Figure 2D:
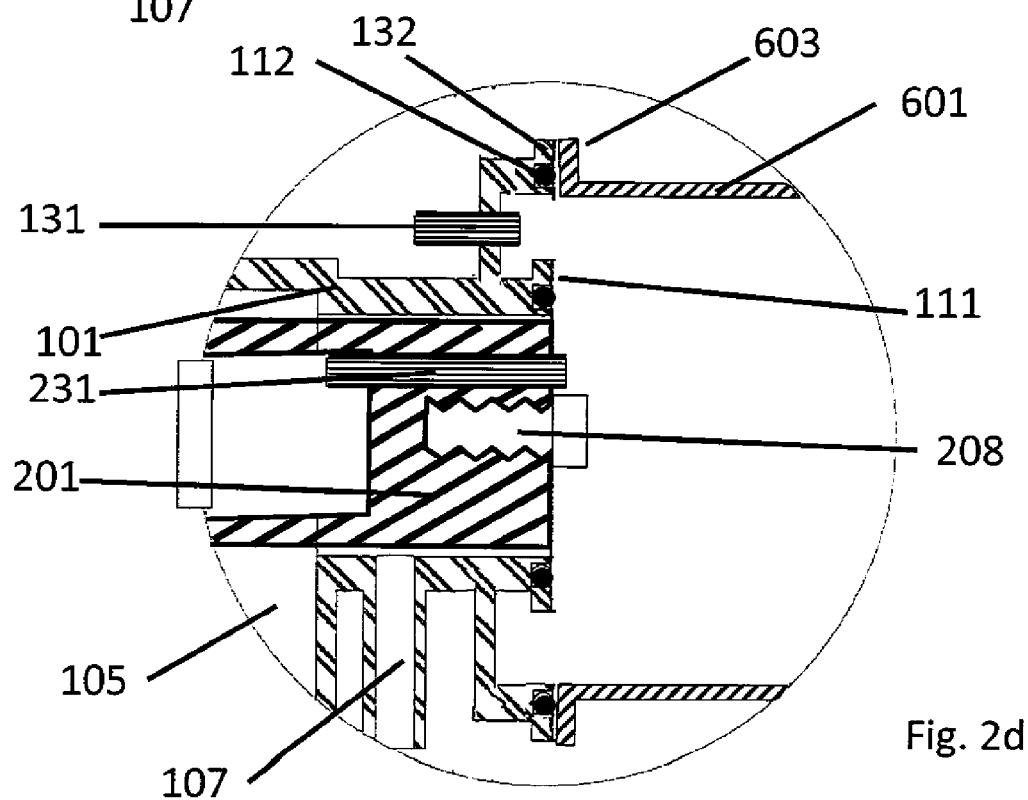

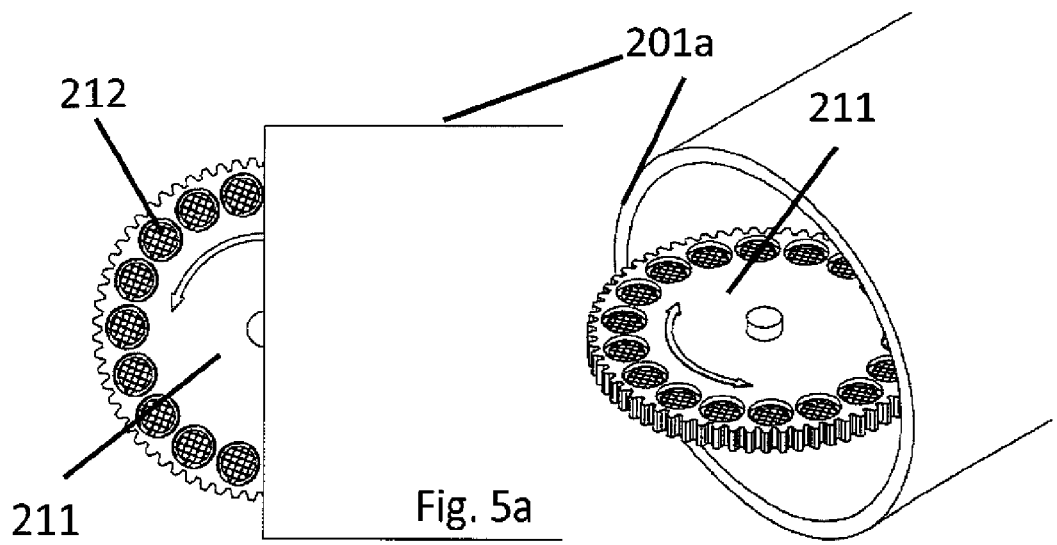
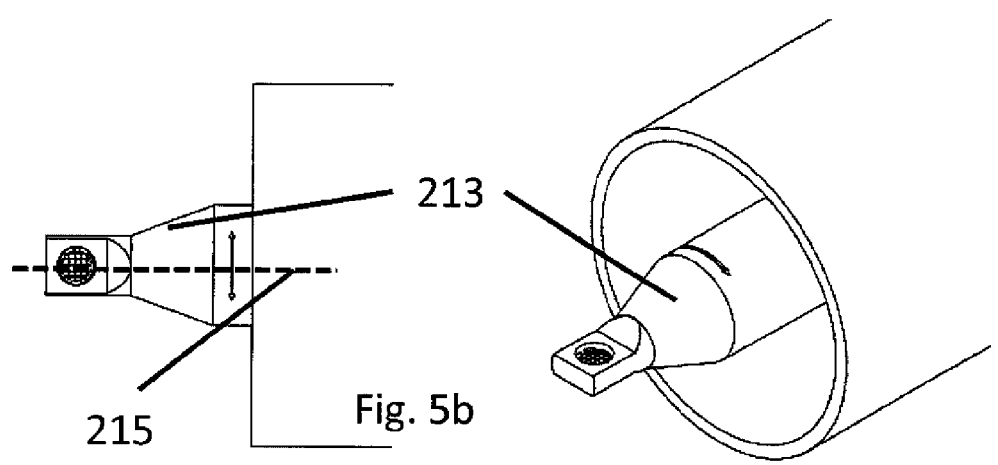
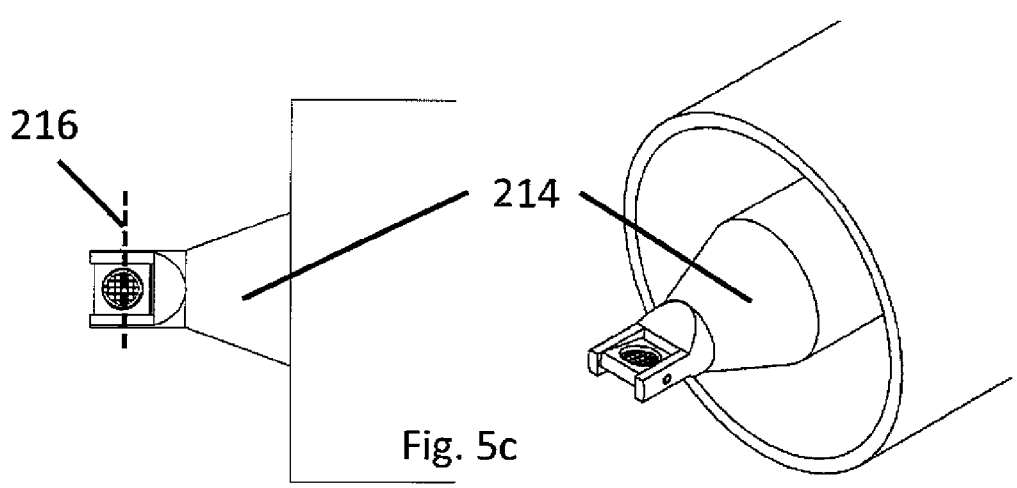

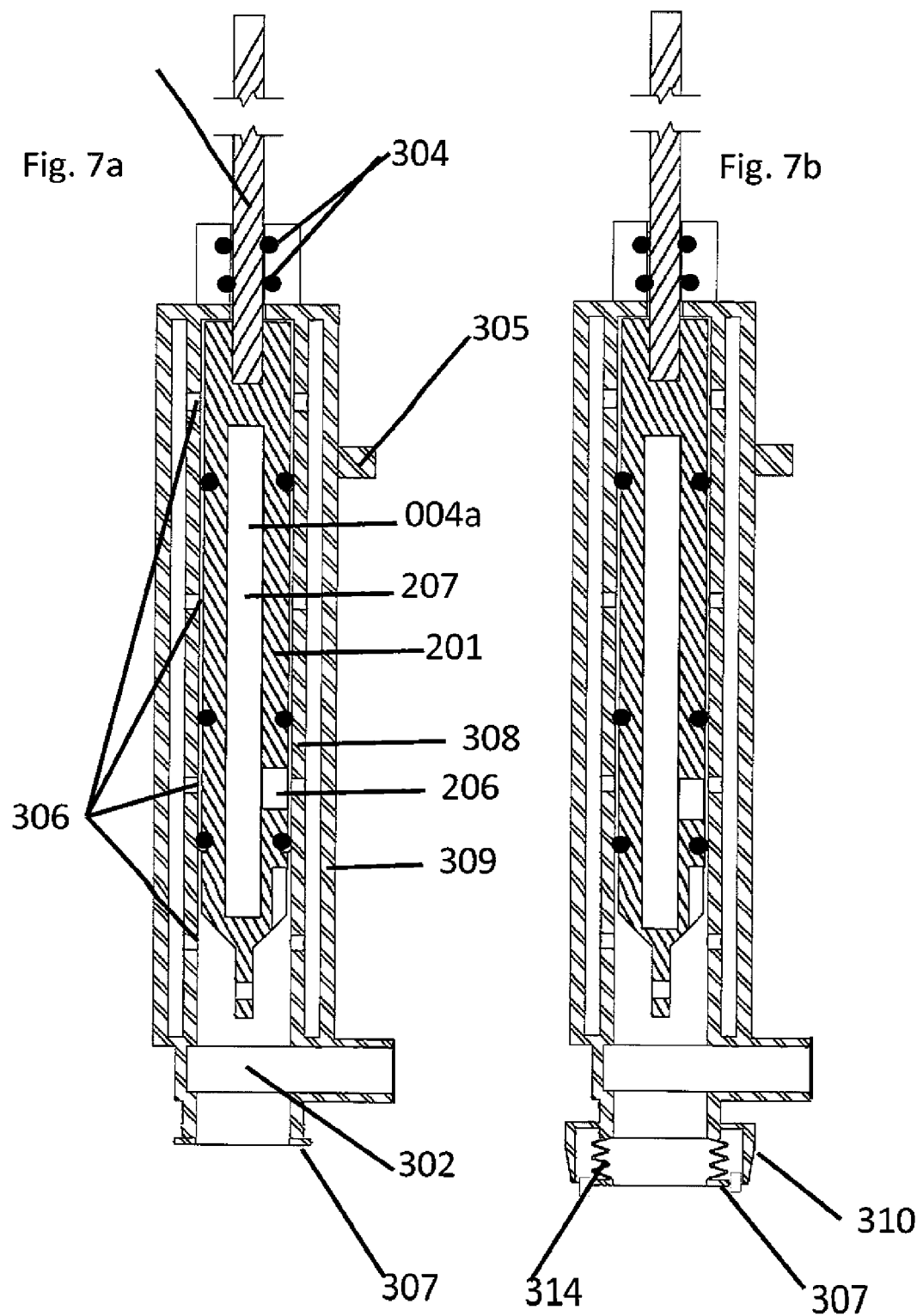

VACUUM TRANSFER ASSEMBLY

FIELD OF THE INVENTION

The present invention is in the field of a vacuum transfer assembly, such as for cryotransfer, and specifically a TEM vacuum transfer assembly, which can be used in microscopy, a sample holder, a vacuum housing, a sample holder stage and a sample holder coupling unit for use in the assembly, and a microscope comprising said assembly as well as a method of vacuum transfer into a microscope.

BACKGROUND OF THE INVENTION

The present invention is in the field of microscopy, specifically in the field of electron and focused ion beam microscopy (EM and FIB), and in particular Transmission Electron Microscopy (TEM). However its application is extendable in principle to any field of microscopy, especially wherein a specimen (or sample) is cooled or needs cooling, or has to be protected from air.

Microscopy is a technique often used in scientific research. It is widely used in life sciences and materials sciences to obtain information in the 0.1 nm to 1 μm resolution domain. In microscopy typically a source is used to obtain an image. The source may be light, electrons, or ions. Under optimal conditions a modern microscope can image a sample with a spot size typically in the order of a few tenth of nanometers for a TEM, a nanometer for a FIB and Scanning (S)EM, and a few hundred nanometers for an optical microscope.

In order to form images of the sample at a location of choice thereof (the sample typically is much larger than an image being formed) and/or at a different orientation, such as under an acute angle, a manipulation device, such as a goniometer, is typically provided in the microscope.

Electron and ion beam microscopes are typically optimized for use at ambient temperature. The microscope and elements of the microscope are therefore preferably substantially at a same temperature. With e.g. a transmission electron microscope a resolution of about 0.1 nm can then be achieved. A sample is typically placed into a holder that—once the sample is placed—is inserted in the microscope. Typically an image is formed in one millisecond to about a second.

At least two types of sample stages exist, an in-column one and a side entry one. A side entry stage compared to an "in-column" stage has the big advantage that a sample holder sticks with one side (the tip of the holder) in a TEM, such that the sample can be placed on the electron optical axis for TEM investigation, whereas the other side is outside of the TEM in ambient air. This allows for cooling of the sample using a cooling source on the outside part of the holder and allows for cryo-transfer of biological samples. In case of material science it allows for application of a wide range of stimuli, such as cooling or heating, electrical biasing, mechanical straining, and addition of gasses and liquids. In-column specimen stages are in general only used to realise an ultra-high vacuum inside the TEM.

An application of a side entry stage is that samples can be cooled with a cooling source outside of the TEM column to e.g. about liquid nitrogen temperature, also referred to as "cryo", which typically is the case for biological samples. In case of biological samples one inserts the sample in a frozen condition into the TEM, which is therefore called cryo-transfer. Another application is in-situ TEM, in which a range of external stimuli are applied to a specimen in the tip of the holder, whereby the stimuli are fed in through the tube of the specimen holder from outside the TEM. Yet another application is to create a closed box around the sample during insertion of the sample holder into the TEM through air, allowing the insertion of air sensitive materials.

In cryo-electron microscopy one typically has to insert a previously (quenched) frozen sample into a cryo-sample holder while the sample is kept below 120 K and preferably below 100 K. This insertion process is called cryo-transfer. This low temperature is needed to prevent that water in the specimen will change its morphology from amorphous ice to crystalline ice.

Prior art systems in which a complete cryotransfer system integrated in a dedicated TEM with a sample holder permanently fitted into a side entry are used are typically expensive and do not allow any in-situ experiments whereas specific cryotransfer holders that can be inserted into the side entry of other TEMs are very user-unfriendly and still allow for specimen degradation due to ice formation on the sample. In Dutch Patent Application NL 2019247 various aspects of cryoloading are discussed. The document and the contents thereof are incorporated by reference.

A prior art cryotransfer holder for cryoloading with a sample in a sample holder typically consists of a holder with a Dewar on the part of the holder that is positioned on the outside of the electron microscope. This Dewar is connected to the tip by a cooling rod inside the holder, which transports "coldness" to the tip of the rod. Only one cryosample can be loaded in the holder and during transfer of the holder through air the sample is covered with a shield to reduce the formation of ice crystals on the sample during transfer of the sample holder into the (T)EM. In prior art cooling holders, a small valve is typically located near the Dewar and before use of the holder for cryotransfer, the holder has to be vacuum pumped through this valve. This pumping takes typically several hours. The valve is small to keep the weight of the holder within an acceptable limit, and therefore the pumping speed being limited by the valve size is low as well.

Prior art vacuum transfer holders typically have a sliding mechanism such that a sample can be pushed in a space that by movement can be sealed airtight or a cover is pulled over the sample to an airtight seal. Typically this airtight sealing is done in a glove box, such that the atmosphere in the sealed area is at about 1 bar. In all cases the sample holder is transferred through air to allow putting it in the specimen stage of the TEM. The sealed area is small given the maximum dimensions of the holder and there is no space for a sensor to measure the effectiveness of the airtight seal and thus one cannot measure the gas conditions to which the sample has been exposed. Moreover, opening the sealed area in the TEM is not an option, since this will deteriorate the vacuum of the TEM too much and opening the sealed area in the airlock will result in a much higher partial pressure of for instance water and oxygen.

It is noted that the side-entry goniometer of prior art TEMs is a very fragile and very complex, whereas it is one of the most essential components of a TEM. It allows for precise movements of the sample in x, y and z as well as a tilt about the axis of the goniometer (α-tilt). The x, y and z positions have a range of typically 2 mm, 2 mm and 0.6 mm, fine adjustments of these x, y and z positions with an accuracy up to 1 nm, and are preferably equipped with piezo-motors for continuous changes in x, y and z to adjust for specimen drift. The α-tilt can be done while keeping the sample area of interest in the field of view, for which the goniometer is equipped with extra components to obtain this eucentricity. On the other hand, the goniometer should have a mechanical stability that allows for <0.1 nm resolution of the samples that are placed in a sample holder that is mounted in the goniometer. Because of the fragility and to not hamper all the movements the goniometer it is only allowed to load a sample holder through the air, such that no mechanical coupling is present with a component that is not part of the goniometer. The insertion through air has a number of disadvantages: a) poor vacuum in the TEM, b) no air sensitive samples can be inserted easily, c) cryotransfer of cryosamples is complicated and always ice formation on the tip of the holder will occur. A further disadvantage of the prior art goniometer is that a small change (<1 mbar) in the ambient pressure in the TEM room can result in a change in the position of the sample because the holder is kept in position in the goniometer by the force of the vacuum in the TEM pulling the holder in, which force is determined by the pressure difference between ambient atmosphere and the vacuum in the TEM (which is typically $10^{-4}$ Pascal or less). In order to minimize this pressure-change effect the TEM manufacturers prefer to keep the diameter of the sample holder small. This small diameter limits the diameters of feedthroughs from the outside holder to the tip, such as a copper tube for cooling, a cryoshield around the Cu tube to minimize coldness loss, electrical wires for heating, biasing and mechanical feedthroughs for instance for the realisation of a second tilt ($\beta$-tilt).

In prior art side entry goniometers the valve that separates the vacuum of the TEM from air, is opened with a mechanism which is driven by a pin that is on the sample holder by rotation of the holder in the goniometer. This is probably a legacy of older microscopes and is probably related to make sure that a user of the TEM cannot vent the TEM column by an accidentally wrong insertion procedure. This method of opening the valve is a hand-driven process. The microscope operator can make mistakes during insertion of the holder and the rotation at a certain point of insertion to open the valve, which mistakes can lead to breakage of the vacuum of the TEM or mechanical damage of the holder or the goniometer. Furthermore the rotation of the holder, needed to open the valve in the goniometer, can lead to accidental loss of components (like the sample falling out), which could accidently not be fixed well in the holder, from the sample holder into the goniometer.

In prior art cryotransfer of cryosamples into a side entry goniometer, the sample has to be exposed to air shortly (like 1 minute). This implies that ice will be formed on the tip of the sample holder which holds the cryosample, and that the temperature of the cryosample is increased. This ice has to be pumped away once the sample holder is in the TEM vacuum, resulting in a poor TEM vacuum until all ice/water is removed. It also requires that in the inside of the holder a vacuum is maintained to prevent warming up of the cooling rod, while the full outside of the holder is at 1 bar. The condition of a good vacuum inside the tube requires that no small vacuum leaks exist anywhere. On the other hand the specimen has to be shielded to prevent ice formation on the cryosample, which can be done with a movable slit, and the movement of this slit has to be operated from the outside of the holder which is at atmospheric pressure. This distribution of some parts that have to be in vacuum, and other parts at atmospheric pressure during transfer but in vacuum once inserted in the TEM, and the remaining parts are at atmospheric pressure all the time, makes cryotransfer through air without compromises impossible.

Once the cryo transfer holder is in the TEM, one would like to pump the inside of the holder with the vacuum systems of the TEM, whereby for UHV in the sample area, the inside of the holder should be pumped continuously by a secondary pumping system. This requires a pumping hole in the sample holder at the position of the inlet to the secondary pumping system and a relatively vacuum tight connection between the tip and the outer tube of the cryo sample holder. It is noted that a small leak at that location is not a problem if the capacity of the pumping system in the TEM column is large and the vacuum of the secondary pumping system is such that a pressure of e.g. $10^{-1}$ Pascal can be realised.

Also for sample holders for in situ experiments the area within the sample holder and the area between the two O-rings closest to the optical axis of the TEM should be preferably pumped continuously. This allows for small vacuum leaks between the inside of the holder and the sample area in the column. This may relax the requirement of complete vacuum tightness for the lines that extend into the tip area for all kinds of in-situ experiments.

For completeness sake some prior art documents are mentioned.

US 2013/168549 A1 recites a method and system which evacuate a sample holder such that a sample can be inserted into the electron optical column of a microscope while certainly preventing exposure to the atmosphere. In this document a method is described in which, apart from the airlock in the goniometer, a second airlock is described, whereby the second airlock is inserted in the goniometer in the position of a standard sample holder and whereby the sample is placed on a rod that is inserted in the second airlock. This has the disadvantage that the rod on which the sample is placed has a small diameter, since it has to fit inside the second airlock, and as further disadvantage that the second airlock adds a substantial length to the goniometer/holder combination, which may result in resolution loss. The small diameter of the rod on which the sample is placed limits the possibilities of sample cooling and adding in-situ stimuli like biasing tools severely. This document does not relate to new possibilities to the capabilities with the existing vacuum transfer holders.

US 2015/243472 A1 recites an electron microscope, which is intended to reduce drift in a sample which occurs because of distortion in an O-ring which seals off from the atmosphere a sample chamber in which vacuum is retained, wherein a sample holder is inserted in a column. It describes reduction of sample drift due to elastic deformations of the O-ring that is used to seal of the microscope vacuum from the ambient air. It is considered to be a relatively small modification in an existing goniometer.

US 2016/276126 A1 of the present inventor recites a low specimen drift holder and cooler for use in microscopy, and a microscope comprising said holder. The document describes several measures to reduce the specimen drift of sample cooling holders applied in TEMs while keeping the image quality high, like better then 1 Å resolution. It is an improvement of a cooling holder that has to fit into a standard goniometer of commercial TEMs.

US 2009/078060 A1 recites an apparatus for the transfer of samples from an analytical instrument has a sealable transfer capsule and a means for connecting the transfer capsule to a vacuum instrument through an interface connected to the instrument. It describes a vacuum transfer system for transfer of samples from a Focused Ion Beam (FIB) system into a glove box or a TEM holder. The TEM holder is not specified and from the text it can be assumed that the authors envisage a TEM sample storage container.

The present invention therefore relates to a vacuum transfer assembly for use in (combination with) microscopy, and a microscope comprising said system, which solve one or more of the above problems and drawbacks of the prior art, providing reliable results, without jeopardizing functionality and advantages.

SUMMARY OF THE INVENTION

The present invention relates to a vacuum transfer assembly for use in a microscope, the microscope comprising a port mounted in an outer wall thereof, said port adapted to receive and mount a sample holder stage of the vacuum transfer assembly, the vacuum transfer assembly comprising a sample holder 201, a vacuum housing 301 for transfer and vacuum insertion of the sample holder into a sample holder stage for removably attaching to the microscope, a coupling unit 401 for coupling the vacuum housing directly or indirectly to a microscope, and a sample holder stage 101. The present invention effectively relates to a complete re-design of a vacuum transfer assembly, in view of experimental requirements. Thereto all the elements of the assembly (sample holder, vacuum housing, sample holder stage, and sample holder coupling unit) had to be considered in view of the experiments and in view of the relation between the elements. The invention therefore consists of a complementary set of major modifications to both the sample holder and the receiving sample holder stage, which—in combination—allow for new experimental in-situ at low temperatures and with full control over the environment around the sample during transfer into e.g. the TEM. The present assembly and parts thereof provide a good vacuum transfer keeping full advantages of side entry, and a better cooling of cryo samples in a side entry sample holder stage, amongst others, such as an adapted side entry goniometer. As the sample holder can be inserted while maintaining a good vacuum around the tip of the holder, cryotransfer of cryosamples now becomes very easy and the holder can be optimized for long experiments, such as several days. As the sample rod is wider, cooling of the tip of the sample to keep the temperature all the time below 120 K is very easy. As the sample holder has a larger diameter one can realise a cooling holder that can go as low as 4 K, in view of a cryo shield at liquid nitrogen temperature over the full length of the sample holder. As the sample rod is wider, one can add more stimuli to the sample. As the sample rod is wider, one can not only load bigger samples but also provide for a transfer under vacuum to other analysis equipment, such as (nano) SIMS, (nano)XPS and light optical microscopes. As the sample rod is wider, one can add extra tools such as an α-tilt to the holder itself. With the present sample holder stage it is also much easier to maintain a very low vacuum in the TEM. An advantage is that the sample holder stage can be made stiffer, such that a change in pressure in the TEM room does not lead to a change in position of the sample, which in turn provides better images with a higher resolution. Thereto typically the α-tilt capability and eucentric adjustment in the sample holder stage is absent. In state of the art transmission electron microscopes the goniometer allows for specimen displacements in the x, y and z direction and for a rotation of the sample around the axis of the sample holder that is placed in the goniometer. The commercial companies have goniometers with these 4 degrees (xyzα) of freedom and they use sample holder diameters in the range from about 10 to 20 mm at the position of the O-ring(s) that are used as vacuum seal(s). A small holder-diameter is selected because pressure changes (for instance by opening a door) can create specimen drifts that scale with the square of the diameter.

In the present invention the α rotation freedom of the goniometer is removed, and the xyz displacement is kept and to distinguish from the old type of goniometer, we call this part of the TEM that does these displacements a xyz stage. With the present procedure of coupling of the sample holder to the sample holder stage a high vacuum transfer of the holder into the sample holder stage is provided. The sample holder stage is mounted on a TEM using a port 001a in the wall 001 of TEM column and provided with one or more vacuum seals 003a to realise UHV in the TEM column. With the much larger diameter of the holder inventors now can provide an α-tilt system within the holder itself. Also an extra flange is added to the sample holder stage to improve the vacuum, in part by making sure that the inner part of the sample holder stage that comes in contact with the vacuum of the TEM can always be pumped. The bore for the holder may be at least 30 mm. The present assembly provides the option of administration of various stimuli to the sample and measure the response within the very limited space in the sample holder and the TEM.

In case of cryotransfer the cryosample can now be loaded into the cryotransfer holder in vacuum using a special vacuum transfer chamber. In that case the tip of the sample holder will be still ice free and the inside of the tube can be pumped with the vacuum system of the cryo vacuum transfer chamber; the vacuum systems of the TEM can be used once the cryotransfer holder is in the TEM. In case one wants to maintain UHV in the column, one needs for the pumping of the inside of the tube of the holder a hole is the tube wall because for the UHV in the tip area a good vacuum seal between the tip of the holder and the tube is required.

It is now possible to have an ultra-high vacuum in the microscope. Such may require a separate pumping of the inside of the holder, a (almost) vacuum tightness between the tip and the tube of the sample holder, pumping through a hole or holes in the tube of the sample holder, and insertion of clean sample holder tips, without exposure to air.

A further advantage is that with the pumping system connected to the outer section of the receiving rod and using an easy add on of a hood on the receiving rod one may create a vacuum around the outer end of the sample holder. In this case a change in ambient pressure in a TEM room has been found not to effect the position of the sample. In case a hood is placed over a receiving rod, all connections like electrical ones can be done within the hood (or through the hood). Note that with vacuum in the vacuum hood 601 there is no force that pushes the sample holder into the tube 103 of the sample holder stage, whereas in case there is atmospheric pressure on the outside part of the holder is pushed in with a force of 10 Newton per cm$^2$. In both cases the sample has to be provided in tube 103. In case of a vacuum on the outside part of the holder one can apply a force similar to the atmospheric pressure by the use of a spring 611.

A further advantage of the present sample holder stage is that the stage is much less sensitive to vibrations such that a good resolution can be achieved easier and more complicated and heavier sample holders (such as a 4.2 K sample holder) can be used without a degradation of the resolution or drift performance of a total system (TEM+stage+sample holder+sample).

A further advantage is that the present holder is so wide that one can realise more sample movements, such as an alpha tilt, such as realised by rotation of the sample stage in the sample holder itself.

In the present invention there is no secondary airlock to be placed in the goniometer, such that the full bore diameter of the goniometer/xyz stage can be used. The present invention does not have a tube in a tube, which allows for better mechanical stability and thus a better image resolution. The present tube has the same maximum diameter over the full sample holder and no larger knob on the outside uniform tube diameter, such that the temporarily airlock can slide over the holder to remove it completely. The present xyz stage allows for a stiffer mechanical construction which favours a better resolution and specimen drift stabilisation. Contrary to prior art in the present invention basic experimental requirements are taken as starting point (like vacuum cryotransfer, the need for liquid He temperatures at the sample position, the need for more space for in-situ experiments and the holder/stage combination is optimized for these requirements).

The vacuum housing, which may also be referred to as vacuum transport or transfer container, can receive a sample holder 201. The sample holder has an outer tube having an outer diameter that is constant (uniform) over a longitudinal axis of the tube, i.e. over at least 50% of said axis, preferably over at least 80%, more preferably over at least 90%, such as at least 95%, so no notch or rib is present but a groove or the like for receiving a seal is present, typically such that a diameter of the outer tube including the seals is slightly larger than the diameter of the outer tube without the seals, such as 0.1 mm larger, at least three seals 205 provided on the outer tube, wherein each seal has the same diameter, such as O-rings, spaced apart from one and another, which seals are adapted to act as vacuum seals at various locations, and a sample stage 204 located at a tip 202 of the sample holder. An objective of the uniform diameter is that the sample holder can easily slide into and out of the vacuum housing and into and out of the sample holder stage, whereby the seals (such as O-rings) act as vacuum seals at various locations where the seals are provided relative to the vacuum housing and sample holder, respectively. The vacuum housing 301 has at least one vacuum housing valve 302, and a connector 307 adapted to be connected to a sample holder stage, wherein the sample holder and vacuum housing are adapted to provide sliding of the sample holder into and out of the vacuum housing. The sample stage may comprise a stage, such as an xyz stage, and one or more tilters.

The sample holder stage comprises at least two cooperating sample holder stage valves 104,105, adapted to restrict a common space between said valves (104,105), and a receiving section 103 for receiving the sample holder 201, wherein an outer diameter of the outer tube of the sample holder is adapted to fit into an inner diameter of a receiving section of the sample holder stage and of the vacuum housing. The sample holder stage is typically void of an α-tilter and a eucentricity adjuster.

The present invention also relates to the vacuum housing, to the sample holder stage, to a sample holder, to a sample holder coupling unit, to an improved microscope comprising the present assembly or parts thereof, and to a method of vacuum transfer.

Thereby the present invention provides a solution to one or more of the above mentioned problems and drawbacks.

Advantages of the present description are detailed throughout the description.

DETAILED DESCRIPTION OF THE INVENTION

The present invention relates in a first aspect to a vacuum transfer assembly according to claim 1.

In an exemplary embodiment the present assembly may comprise a loading rod 303 in connection with the sample holder 201 to allow controlled loading of the sample holder into the final position in the TEM and vice versa which could be computer controlled.

In an exemplary embodiment of the present assembly at least one of a length of the vacuum housing may be larger than a length of the outer tube, the vacuum housing valve may be located at a first end of the vacuum housing, and wherein at the other end of the vacuum housing a narrow section may be provided comprising a fourth seal 304, and the narrow section provides passage to the loading rod or insertion bar.

The present assembly comprises at least one of a fixator 405 for attaching to microscope column 001 for fixating the aligner of the vacuum housing 310 to the TEM column, a fixator 121 in the sample holder stage that is coupled to its counterpart 221 of the sample holder to fixate the position of the sample holder in the sample holder stage, and a bellow provided in the vacuum housing.

In an exemplary embodiment of the present assembly the sample holder stage 101 at the receiving flange 111 of section 103 may be provided with a vacuum hood 601, wherein the vacuum hood is preferably removably attached to a coupling unit or can be rotated away.

In an exemplary embodiment of the present assembly the sample holder may comprise at least one of a sample holder recognition element, a cooling rod inside the outer tube, a marker for determining a spatial location of the sample holder with respect to the sample holder stage, an α-tilter and/or β-tilter, and a scale for positioning, such as an optical or electromagnetically recognizable scale (1 μm precision).

In an exemplary embodiment of the present assembly the sample holder may comprise at least one of a multi sample receiver, such as a carousel or a cartridge, a sample loader, an electrical connection, and a sensor.

In an exemplary embodiment of the present assembly the sample holder stage may comprise at least one of a sample holder aligner preferably incorporated in the receiving section, and an electrical connection for in-situ experiments, a connection for electrically controlling the rotator or α-tilter and/or β-tilter, a rotator, such as a step motor (0.02°), an α-tilter.

In an exemplary embodiment of the present assembly a length of the vacuum housing may be smaller than a length of the outer tube, and wherein a cooling braid 241 may be attached to the outer tube.

In an exemplary embodiment of the present assembly at least one of the outer tube of the sample holder may have a diameter of >18 mm, preferably >20 mm, more preferably 22-60 mm, even more preferably 25-50 mm, such as 30-40 mm, a length of 10-60 cm, the vacuum housing may have an outer diameter of 22-70 mm, a length of 10-70 cm, wherein the outer tube may be made of a light weight metal, such as Ti, wherein the vacuum housing may be made of a light weight metal, such as Ti, wherein the seals may be made of natural or synthetic rubber, and a motor for controlled movement, such as for the vacuum housing, and for the sample holder.

The present assembly sample holder stage comprises a flange 111, wherein the flange is adapted to receive the flange 307 of the vacuum housing 301, and wherein the combined flanges comprise at least one seal.

In an exemplary embodiment of the present assembly sample holder stage may comprise at least one of an additional flange 111,132 and at least one seal 112 in the flange, wherein the flange is adapted to receive the flange 307 of the vacuum housing 301, electrical connections, a sample holder identifier, a lock 121, and a pumping tube 106,107.

In an exemplary embodiment of the present assembly at least a part of the sample holder stage or vacuum housing prone to exposure to the environment may be coated with a hydrophobic coating, such as PTFE.

In an exemplary embodiment of the present assembly the at least three seals 205 provided on the outer tube may be spaced apart from one and another such that when inserted into the sample holder stage a first seal 205 is provided preventing gas flow into the (TE)M from the first valve 104 and all areas beyond that from the UHV vacuum of the microscope, and the second and third seal 205 are adjacent to either sides of the second sample holder stage valve 105.

In a second aspect the present invention relates to a microscope selected from a TEM, a SEM, optical microscope, and a FIB, comprising an assembly or assembly part according to the invention.

In a third aspect the present invention relates to a method of vacuum transfer comprising providing an assembly according to the invention, bringing a sample under vacuum, introducing the sample into the sample stage, transferring the assembly to a microscope, introducing the sample holder into the microscope, and optionally recognizing the sample holder by the coupling unit or microscope.

The one or more of the above examples and embodiments may be combined, falling within the scope of the invention.

EXAMPLES

Exemplary Workflow for Vacuum Transfer
1. Set the 401 coupling unit and the sample holder stage 101 in the receive-position.
2. Load the sample in the tip of the sample holder 201 that is located in a glove box 901.
3. Draw back the sample holder fully into the vacuum housing 301.
4. Close the valve of the glove box and the valve 302 of the vacuum housing (pressure within vacuum housing is still at about 1 bar with e.g. Ar; alternatively the vacuum housing can be evacuated through tube 913 before closing the valve on the vacuum housing).
5. Decouple the vacuum housing (with the sample holder in it) from the glove box.
6. Place the vacuum housing (with the sample holder in it) on the coupling unit and clamp the two together.
7. Move the vacuum housing with the coupling unit such that the vacuum housing is fully aligned with the sample holder stage with a separation distance of e.g. 2 mm.
8. Activate the electromagnet to make a connection between the flange of the vacuum housing and the flange of the sample holder stage.
9. Pump the connection area 005 (space in between the vacuum housing and the sample holder stage)
10. Once the vacuum is low enough, open the valve on the vacuum housing
11. Open the first valve 105 of the sample holder stage
12. Place the sample holder in the sample holder stage such that the tip of the holder is just in front of the second valve of the sample holder stage, using the loading rod 303.
13. Pump again to reach a very good vacuum
14. Open the second valve 104 of the sample holder stage
15. Insert the sample holder further in such that sample is on the optical axis of the TEM using the loading rod.
16. Decouple the loading rod from the sample holder.
17. Decouple the vacuum housing from the sample holder stage
18. Place the vacuum hood on the flange 111 of the sample holder stage.
19. Option: Evacuate the area in the vacuum hood.
20. Option: Remove the vacuum housing
21. Removal of the holder as follows
22. Remove the vacuum hood
23. Connect (including with the bellow and activation of electromagnet) the vacuum housing
24. Pump the connection area
25. Open the valve of the vacuum housing.
26. Connect the loading rod
27. Pull out the holder until inner valve can be closed.
28. Close the inner valve.
29. Pull out the holder fully into the vacuum housing
30. Close the outer valve of the sample holder stage and of the vacuum housing.
31. Vent the connection area
32. Decouple the vacuum housing from the sample holder stage using the sample holder aligner.

Exemplary Workflow for the System with Cryo Vacuum Transfer
1. Set the coupling unit 401 and the sample holder stage 101 in the receive-position.
2. Load the cryo sample 201 with the CVTC system described in the previous patent into the Cryo+ sample holder that is positioned in the vacuum housing 301.
3. Draw back the Cryo+ sample holder into the vacuum housing such that the tip of the holder is in front of the valve 302.
4. Close the valve 302 of the vacuum housing (sample is still in vacuum).
5. Decouple the vacuum housing (with the Cryo+ sample holder in it) from the CVTC
6. Place the vacuum housing (with the Cryo+ sample holder in it) on the coupling unit 401 and clamp the two together.
7. Move with the coupling unit the vacuum housing towards the sample holder stage 101, such that the sample holder is fully aligned to the sample holder stage.
8. Couple the vacuum housing to the sample holder stage using the flanges 111 and 307.
9. Pump the connection area.
10. If vacuum in the connection area is low enough, open the valve on the vacuum housing
11. Open the outer valve of the sample holder stage
12. Place the Cryo+ sample holder in the sample holder stage such that the tip of the holder is just in front of the inner valve of the sample holder stage.
13. Pump again to reach a very good vacuum
14. Open the inner valve of the sample holder stage
15. Insert the holder such that cryo sample is on the optical axis of the TEM
16. Decouple the coupling unit from the vacuum housing (the vacuum suitcase container remains on the sample holder stage.
17. Removal of the holder as follows
18. Connect the coupling unit to the vacuum housing
19. Pull out the holder until inner valve can be closed.
20. Close the inner valve.
21. Pull out the holder fully into the vacuum housing
22. Close the outer valve of the sample holder stage and of the vacuum housing.
23. Vent the connection area
24. Decouple the vacuum housing from the sample holder stage.

The invention is further detailed by the accompanying figures, which are exemplary and explanatory of nature and are not limiting the scope of the invention. To the person skilled in the art it may be clear that many variants, being obvious or not, may be conceivable falling within the scope of protection, defined by the present claims.

FIGURES

The invention although described in detailed explanatory context may be best understood in conjunction with the accompanying figures.

FIGS. 1-14d show exemplary details of the present assembly.

DETAILED DESCRIPTION OF THE FIGURES

List of Elements

001 Outer wall of the column of the TEM
001a Port in the outer wall of the column of the TEM
002 Optical axis of TEM
003 UHV vacuum in the column of the TEM
003a UHV vacuum seal between the sample holder stage and the outer wall of the column
004 HV vacuum in the sample holder stage between the valves
004a HV vacuum in the inside of the sample holder 201
005 connection area with its own pressure like HV vacuum
006 part of coupling unit that is fixed to the TEM column
101 Sample holder stage
102 xyz stage of sample holder stage
103 Tube of sample holder stage to receive the sample holder
104 Inner valve of sample holder stage
105 Outer valve of sample holder stage
106 Pumping tube 1
107 Pumping tube 2
111 Flange with O ring
112 O ring in flange of sample holder stage
121 Positioner of sample holder once it is fully inserted
131 Vacuum tight feed-through like for electrical wires
132 Wider flange to facilitate more extensive feed-throughs
201 Sample holder
201a Outer tube of sample holder
201b Cryo transfer sample holder
201c Sample holder positioned partly or fully in the sample holder stage
202 Tip of the sample holder
203 Sample area
204 Sample stage
205 O ring in the holder
206 Hole in the tube of the holder to allow pumping on the inside area of the holder
207 Inner area of sample holder
208 connection to loading rod
211 Carrousel housing a number of specimens
212 Grid with sample
213 α-tilt device
214 β-tilt device
215 Tilt axis of α-tilt
216 Tilt axis of β-tilt
221 Counterpart of pin 121 of the sample holder stage to fix the position of the sample holder in the sample holder stage
231 Vacuum tight feed-through like for electrical wires
241 Cooling braid
242 Cooling rod of cryo holder
301 Vacuum housing
301a Vacuum housing for general sample holder (including vacuum)
301b Vacuum housing for cryo transfer sample holder
302 Valve of vacuum housing
303 Loading rod to control the position of the holder in the longitudinal direction
304 O ring to close the loading rod airtight
305 Pin on vacuum housing to fix position of vacuum housing in the coupling unit
306 Holes to allow pumping of all areas around and the inside of the sample holder and around it 201
307 Flange to connect to flange (111) of sample holder stage
308 Inner tube that houses the sample holder 201
309 Outer tube that allows pumping of all areas around the sample holder
310 Aligner
311 Motor to drive the loading rod 303
312 Rod to translate the rotation of the motor to a movement in along the longitudinal axis of the holder
313 Coupling between 305 and 312
314 Bellow to allow flexible connection
401 Coupling unit
401a Vertical aligner of the coupling unit
401b Horizontal aligner of the coupling unit
404 Part of aligner 405 connected to TEM column
405 Aligner to receive aligner of vacuum housing
421 XYZ stage holding the vacuum housing
422 Aligner of the XYZ stage
423 Aligner on the column of the TEM
424 Position with aligners 422 and 423 in contact
425 Space between flanges 111 and 307 when position 424 is reached
426 Flanges 111 and 307 are in contact by activation of electromagnet
451 Part of coupling unit to allow fixation of vacuum housing
452 Groves to position the vacuum housing
453 Clamp to fixate the tube part of the vacuum housing
454 Metal ball on which clamp is clicked
461 Hole in one groove in which the pin 305 of the vacuum housing fits
601 Vacuum hood over entrance of sample holder stage
602 Spring to push the sample holder into the stage 101
603 Flange of the vacuum hood
611 Flexible cover over the part of the holder outside of the sample holder stage and the dewar used for cooling the tip of the holder
612 Support for the dewar with liquid nitrogen
613 Cold part of the cryo sample holder that can accumulate ice
901 Cryo vacuum transfer chamber used to load the cryo sample in the holder under cryo vacuum conditions
902 Location where the vacuum housing with the cryotransfer holder is decoupled from the cryo vacuum transfer chamber 901
911 Glove box
912 Valve of the glove box
913 Tube for pumping
914 Location where the vacuum housing with the sample holder is decoupled from the glove box 911
981 Prior art cryo transfer holder without pumping of inner area with vacuum pump of TEM 982 Outside tube of TEM sample holder 981
983 Cooling rod of TEM sample holder
984 O-rings
985 Airtight connector
986 Airtight and low thermal conductance connector
993 Vacuum inside TEM column
995 Interior of holder with its own vacuum
996 Valve to allow pumping of interior part of holder FIG. 1. In FIG. 1a) the position of the coupling unit in the loading position is shown. Part (006) of the coupling unit is rigidly connected to the TEM column. Parts 401a and 401b allow a vertical and horizontal (along the x axis) movement of the vacuum housing. In FIG. 1b) the vacuum housing in brought on the same height as the sample holder stage. In FIG. 1c) the vacuum housing is bought in (aligned) contact with the sample holder stage. 1d) shows the partial insertion of the holder up to the inner valve 104. 1e) shows the holder fully inserted and FIG. 1f) shows the situation where the holder is fully inserted and the vacuum housing is decoupled from the sample holder stage.

FIG. 2 shows two different couplings of the vacuum housing to the sample holder stage. FIG. 2a) depicts the use of two aligning elements, one 405 fixed to the column of the TEM and one 310 being part of the vacuum housing. FIG. 2b) shows the situation whereby the alignment of the vacuum housing is done by an automatic system and which allows for a "soft landing" of the flange 307 of the vacuum housing on the flange 111 of the sample holder stage. FIG. 2c) shows the incorporation of electrical vacuum feed-throughs 131 and 231 in the sample holder stage and the sample holder respectively. FIG. 2d) show the presence of a second flange (132) on the sample holder stage such that more space for feed-throughs such as for electrical contacts 131 is created.

Figure 3:
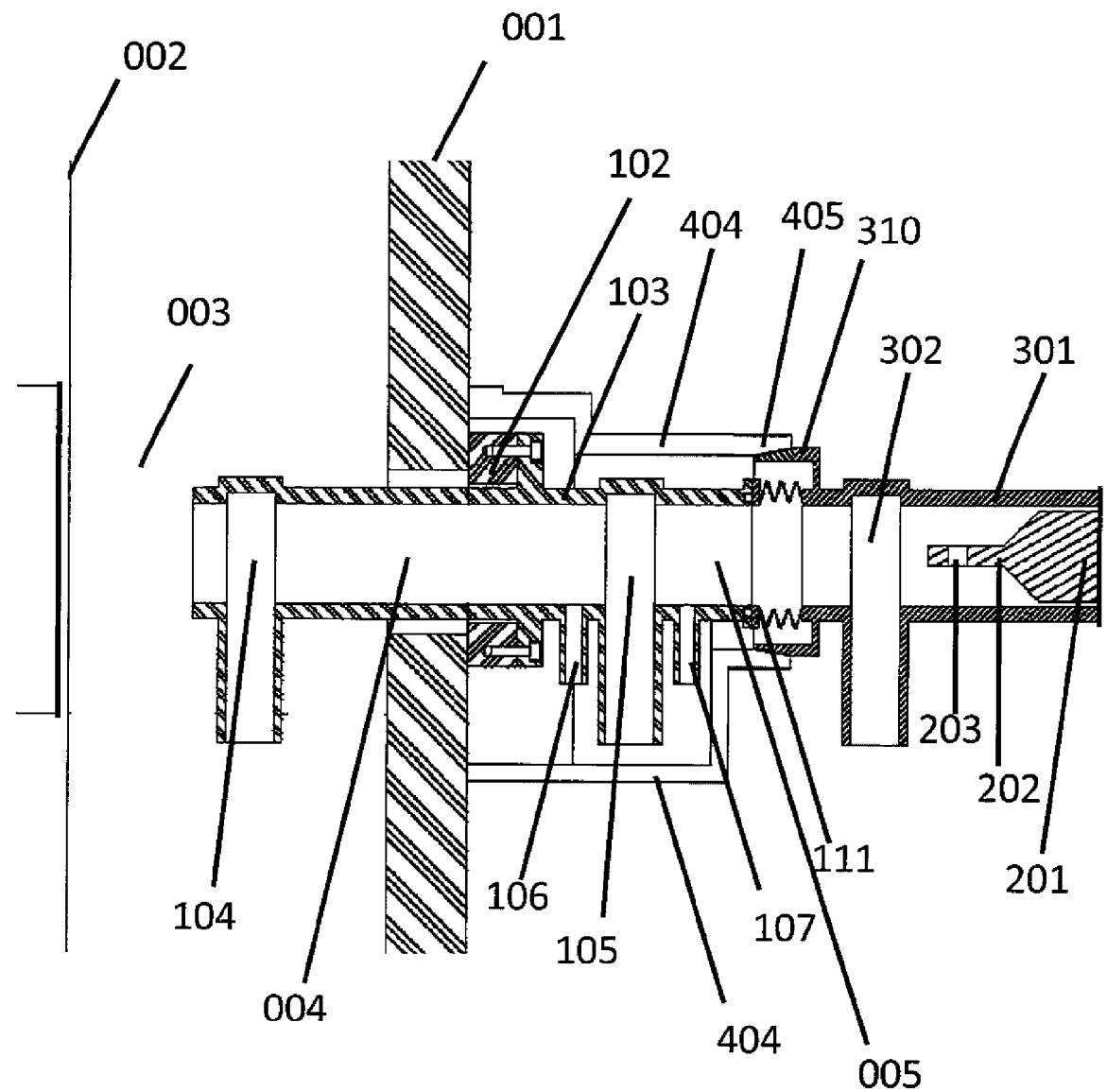

FIG. 3 shows details of the sample holder stage and the coupling of the vacuum housing to the sample holder stage.

Figure 4:
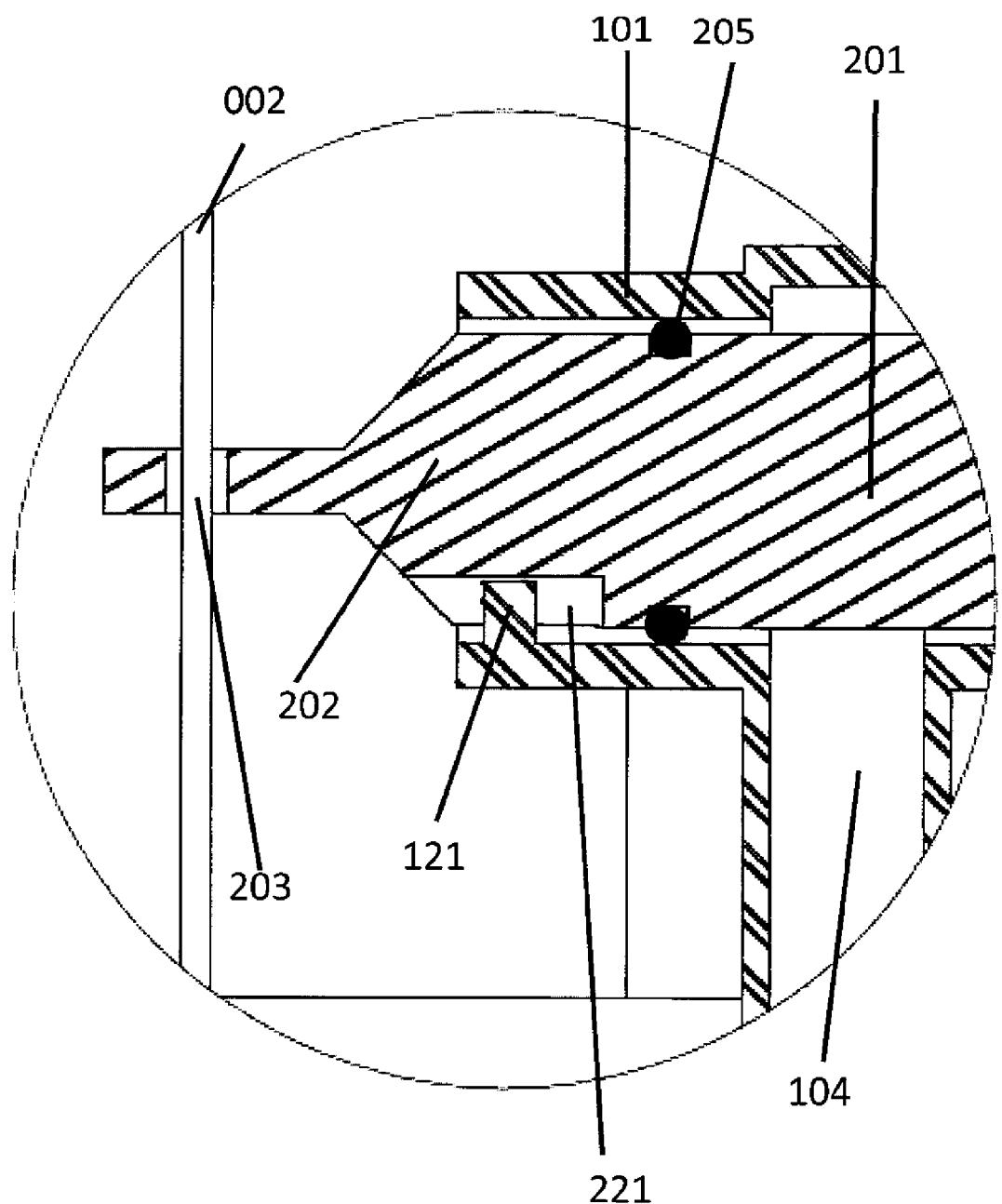

FIG. 4 shows details of the tip 202 of the sample holder in the sample holder stage. The sample holder is fixated in the sample holder stage using the pin 121 in the sample holder stage and its counterpart 221 in the holder.

FIG. 5 Three different examples of specimen stages in the tip of the sample holder. FIG. 5a) shows a carrousel in which a number of grids (e.g. with cryosamples) can be placed and which can be all examined with one insertion of the sample holder. FIGS. 5b) and 5c) show the presence of a tilt stage around the longitudinal axis of the sample holder and perpendicular to this axis respectively.

Figure 6:
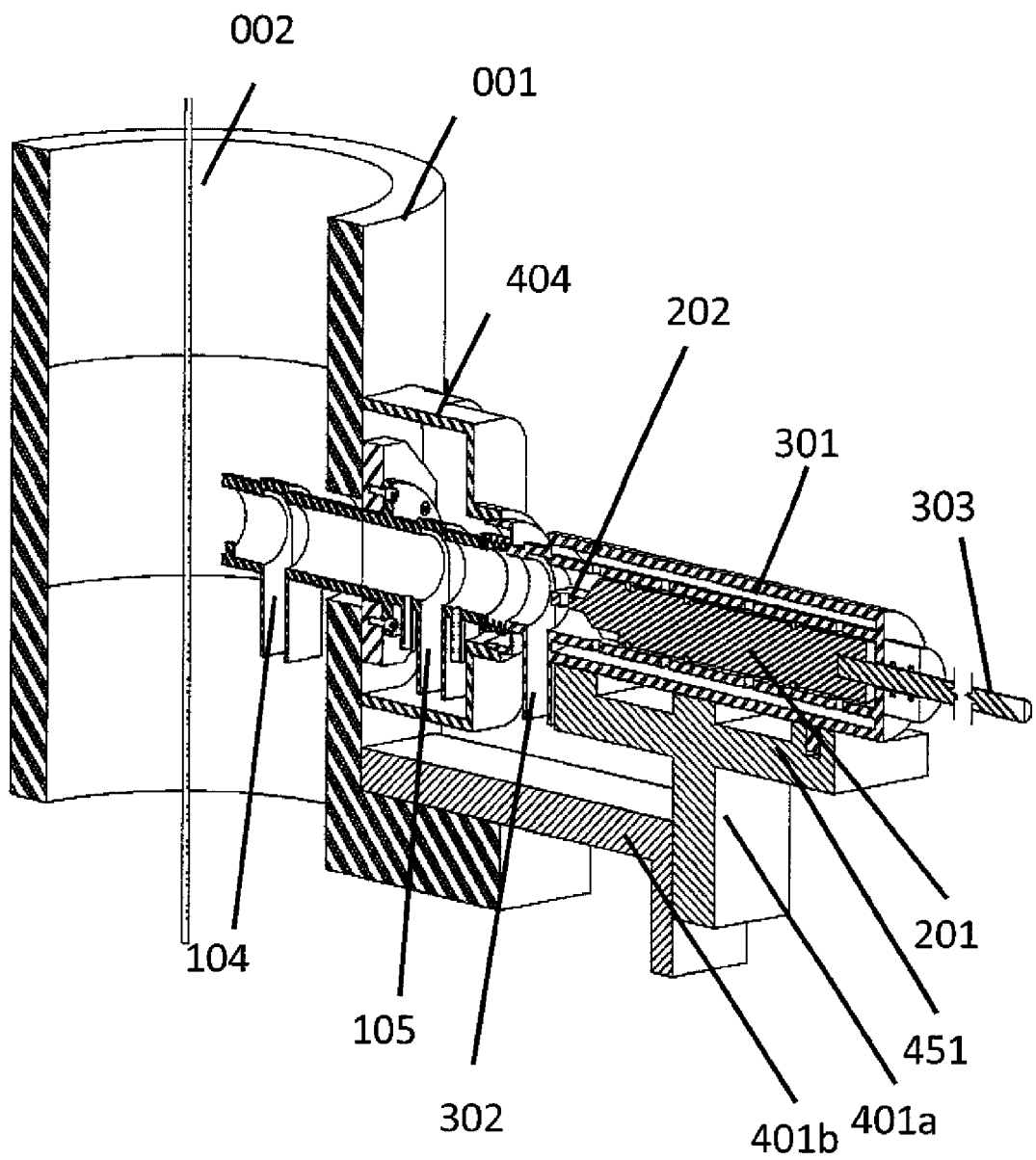
Figure 8A:
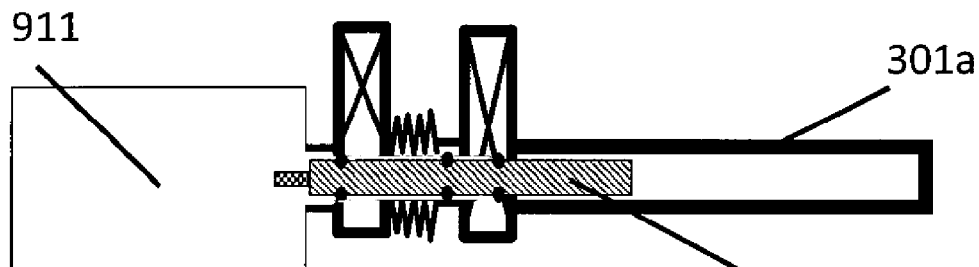
Figure 8B:
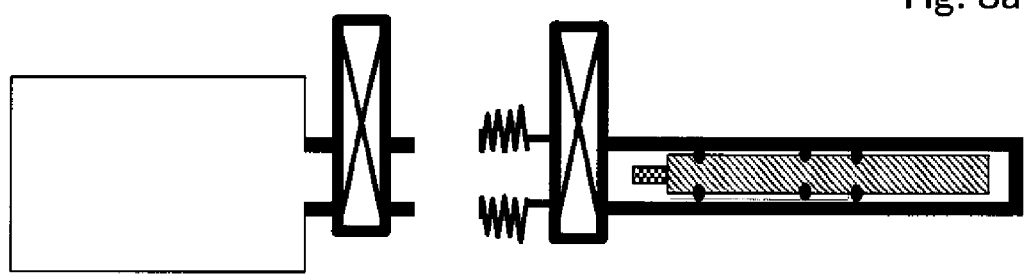
Figure 8C:
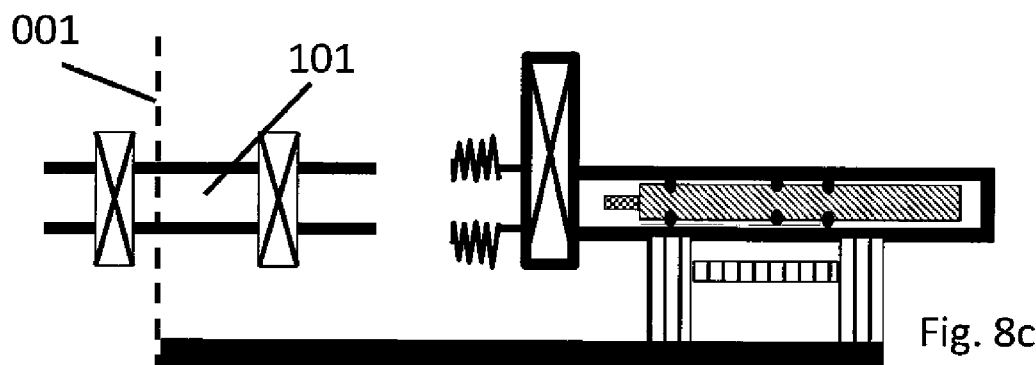
Figure 8D:
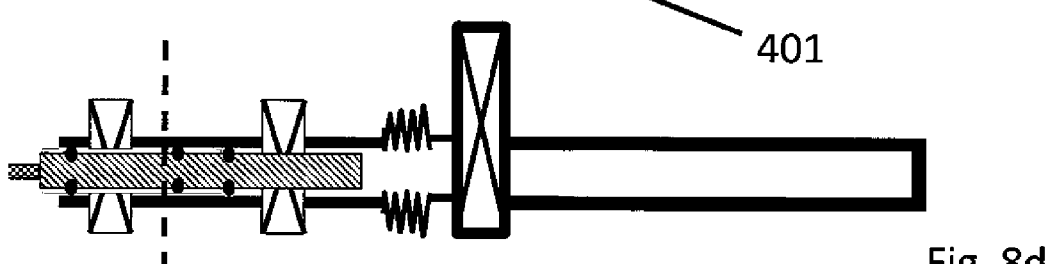
Figure 8E:
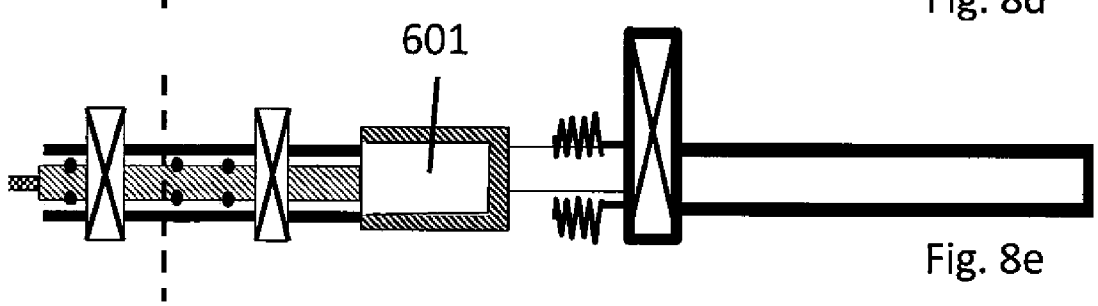
Figure 9A:
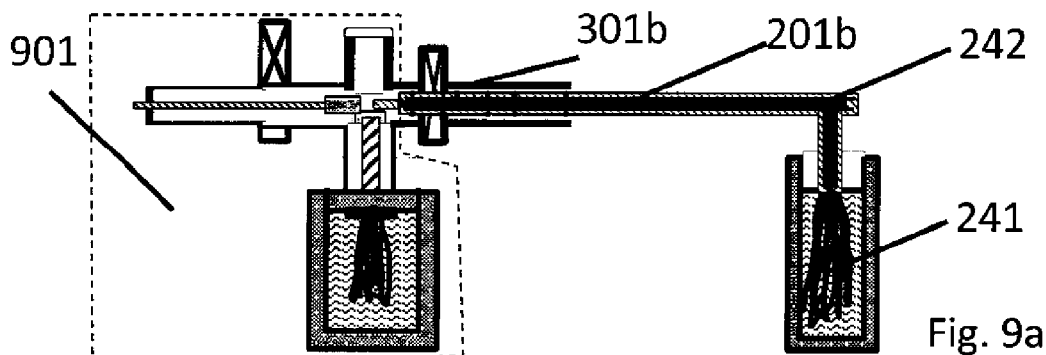
Figure 9B:
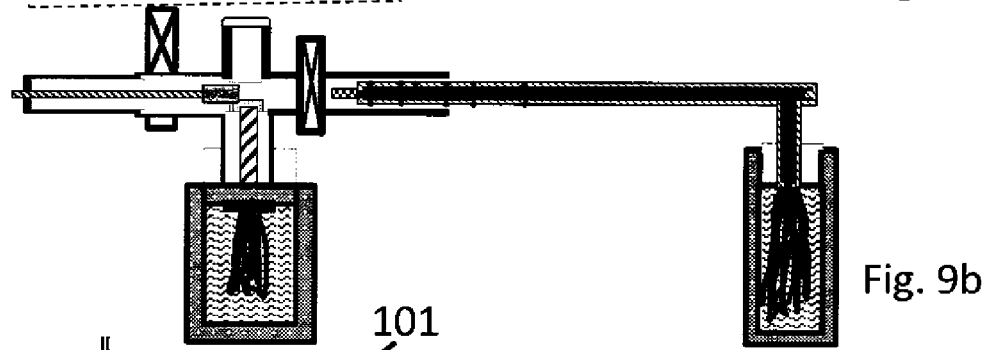
Figure 9C:
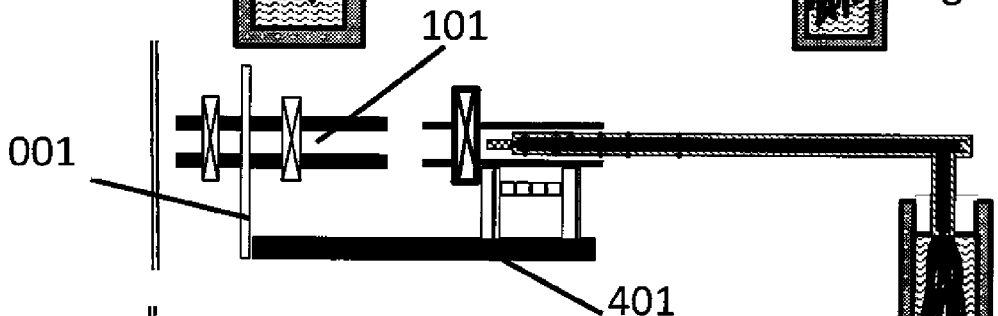
Figure 9D:
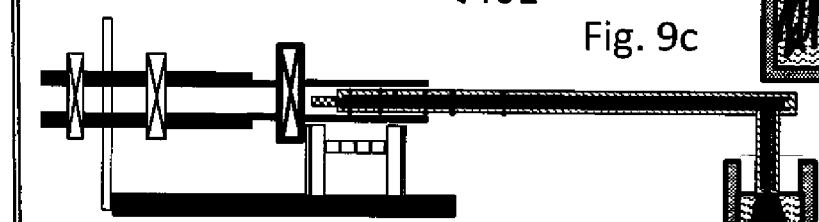
Figure 9E:
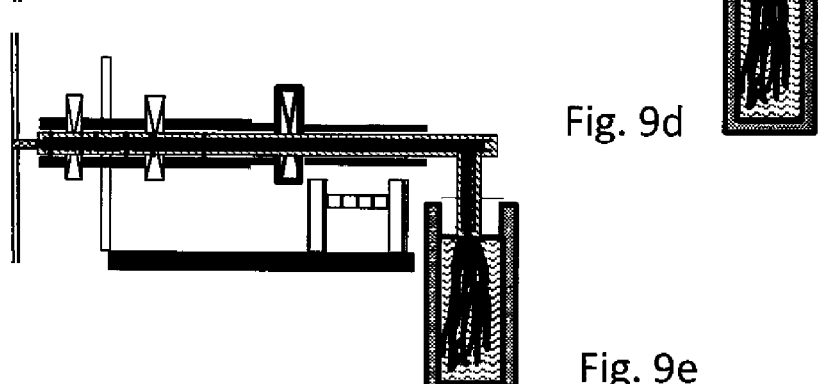
Figure 9F:
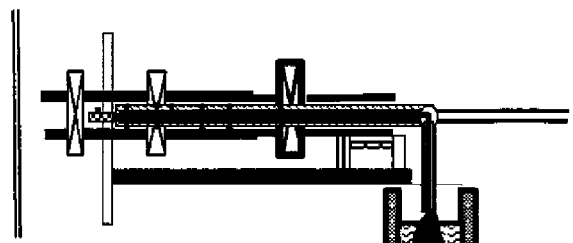
Figure 9G:
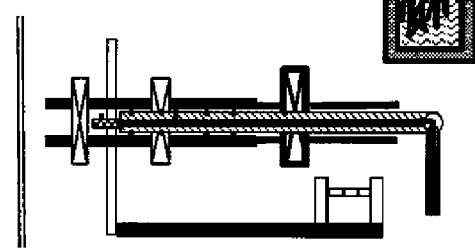
Figure 9H:
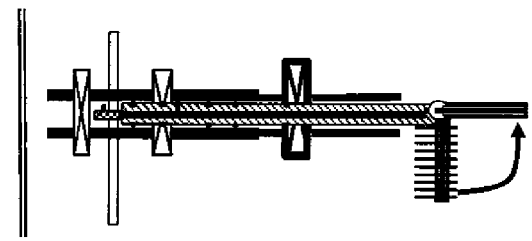
Figure 9I:
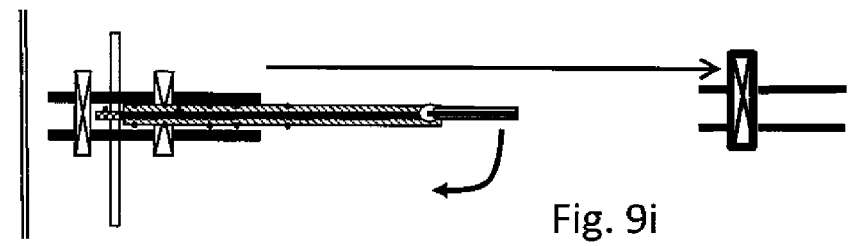
Figure 9J:
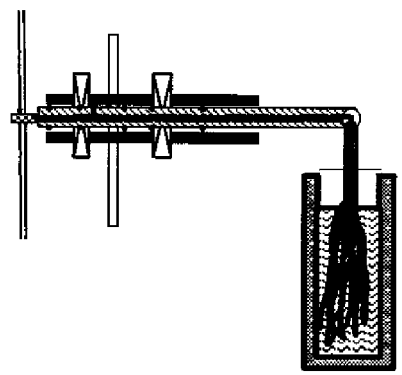

FIG. 6 shows a 3D view of the part of the TEM column, the sample holder stage and the vacuum housing with sample holder in it whereby the vacuum housing is mounted of the coupling unit.

FIG. 7a,b show details of the vacuum housing of a sample holder without any cryo transfer. In order to allow pumping of all areas around the sample holder an outer and inner tube are present with holes 306 in the inner tube. To allow pumping of the inside of the holder a hole 206 in the outer tube of the sample holder is present.

FIGS. 8a-e show a workflow of the vacuum transfer from glove box 911 or other vacuum system to full insertion in the TEM. The figures seem to speak for themselves.

FIGS. 9a-e and 9f-j show two workflows of transport of a cryotransfer holder from a cryovacuum transfer chamber 901 to full insertion in the TEM, whereby the cryovacuum transfer housing 301b is left on the xyz stage (a-e) or completely removed from the stage (f-j) and the holder. For the latter removal of 301b the cooling braid is removed and the vertical part of the holder is rotated to a horizontal configuration or it can be removed. The figures seem to speak for themselves.

Figure 10A:
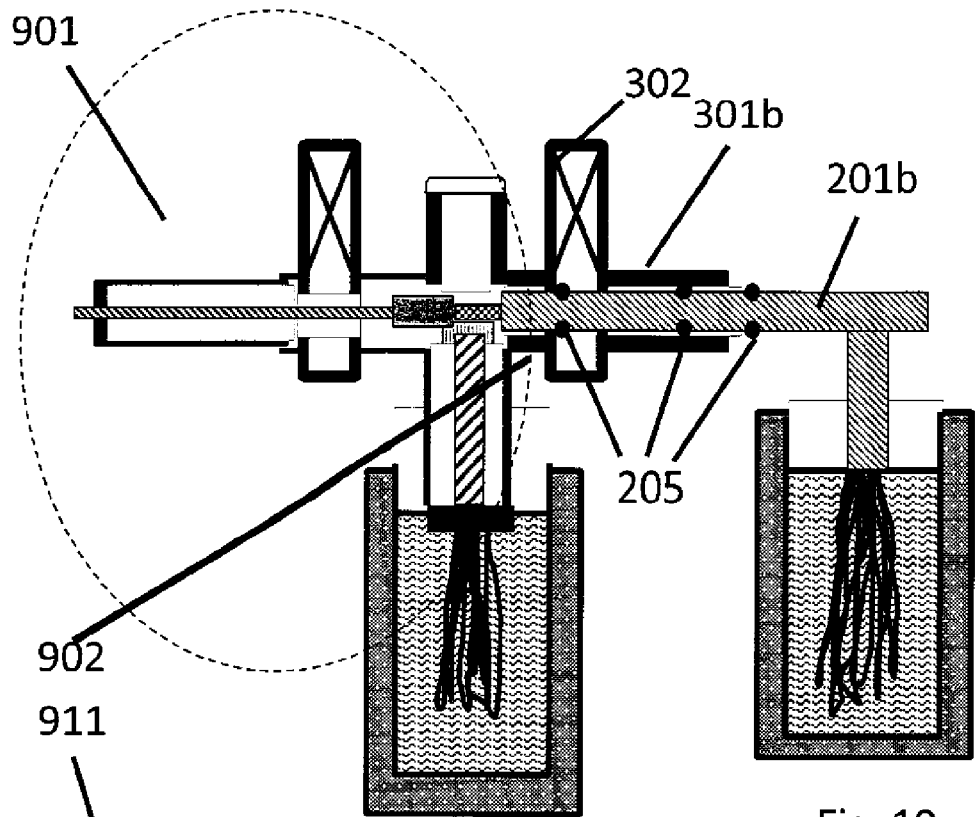
Figure 10B:
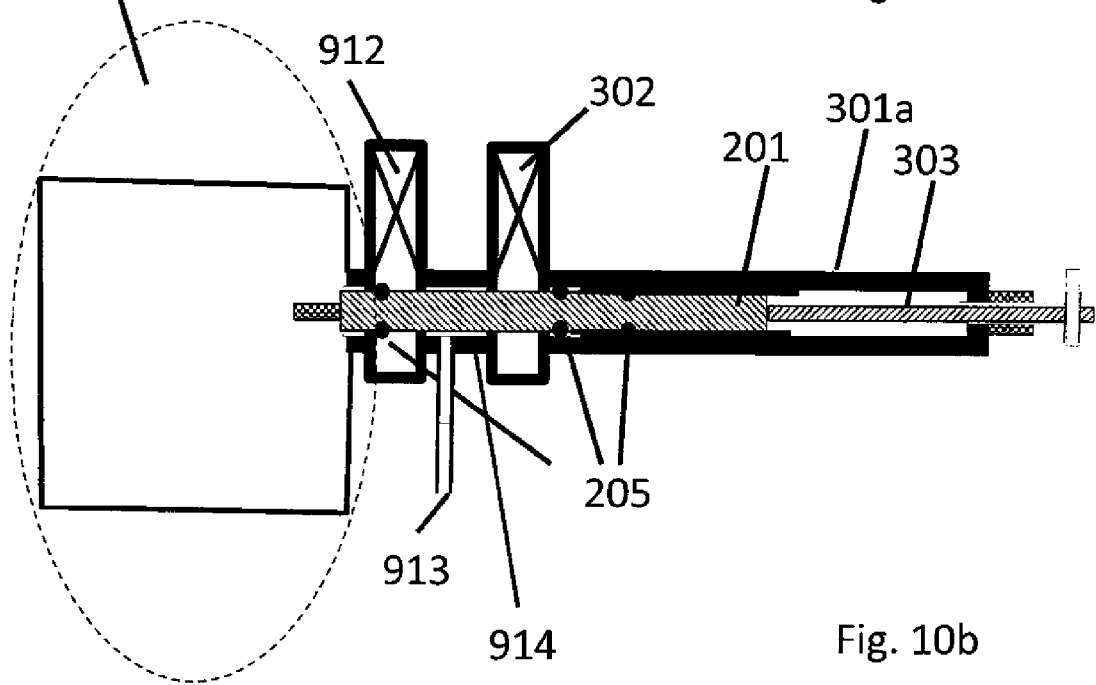

FIGS. 10a,b show two methods of using the vacuum loading system. Here the two starting points are given with in FIG. 10a) the connection of the cryo transfer holder 201b in a vacuum housing 301b to a cryo vacuum transport chamber 901; the decoupling is done at position 904 and FIG. 10b) the connection of a sample holder 201 in a vacuum housing 301a to a glove box 911; the decoupling is done at position 914.

Figure 11A:
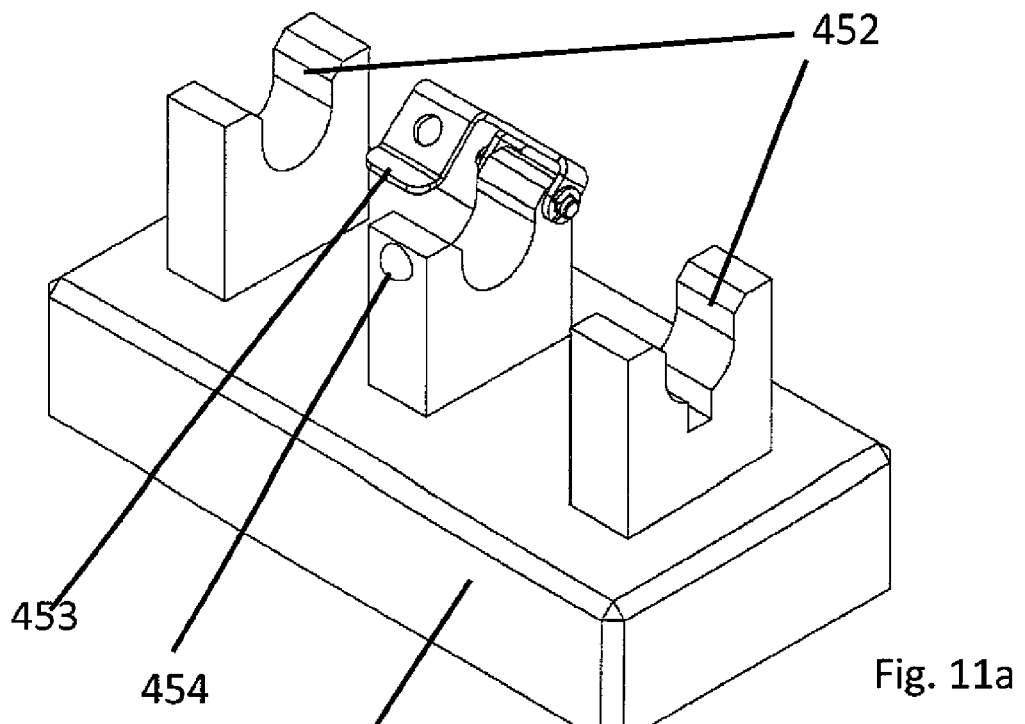
Figure 11B:
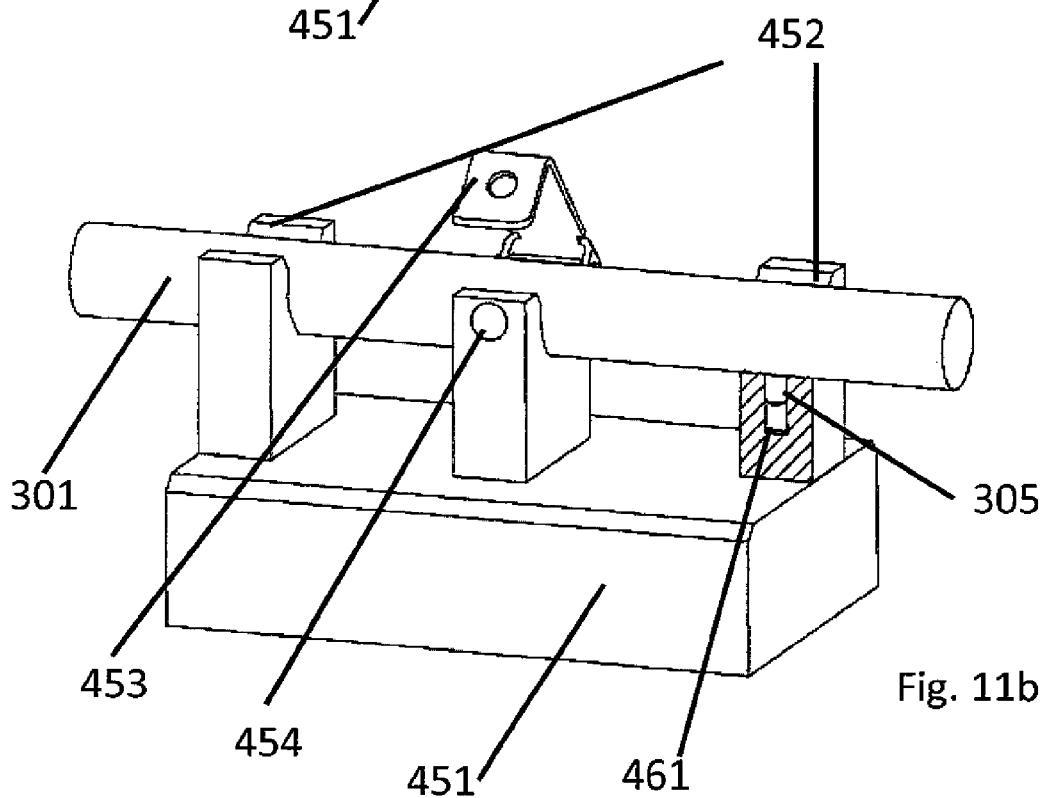

FIGS. 11a,b show clamping mechanism to place the vacuum housing in the vacuum housing support. The vacuum housing with the holder in it is placed in the two grooves 452 such that the pin 305 of the vacuum housing is positioned in the receiving hole 461 in one of the elements with the groove. Next (FIG. 11b) the vacuum housing is fully positioned using the clamp 453 that is clicked on the ball 454.

Figure 12A:
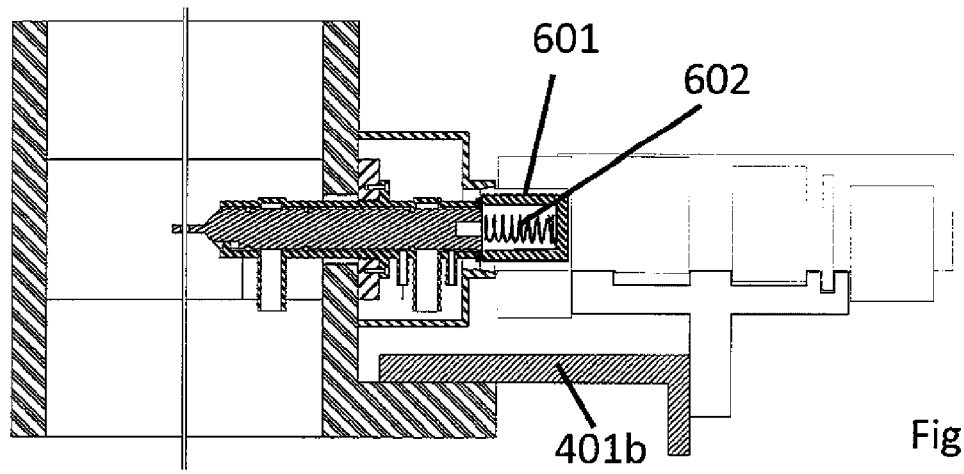
Figure 12B:
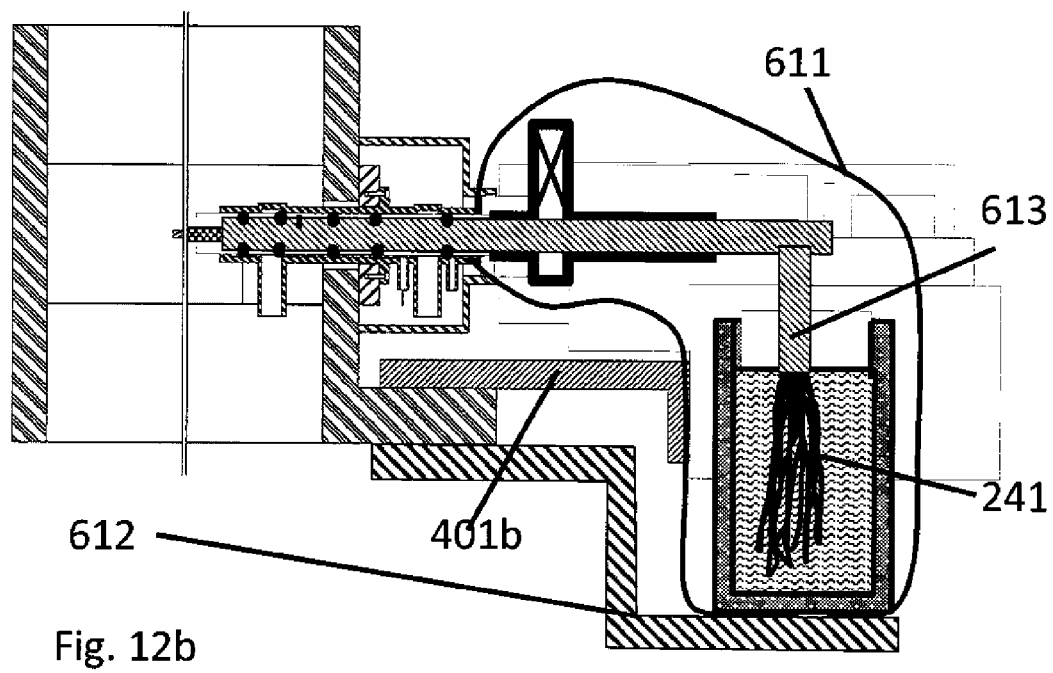

FIG. 12. Two shields that are applied after the sample holder is loaded into the sample holder stage. FIG. 12a) shows the configuration of a vacuum hood 601 that—after connection to the flange 111 of the sample holder stage—is pumped to vacuum with the pumping line 107. FIG. 12b) shows the position of a flexible cover to reduce ice formation on the dewar and on the cold part 613 of the holder.

Figure 13A:
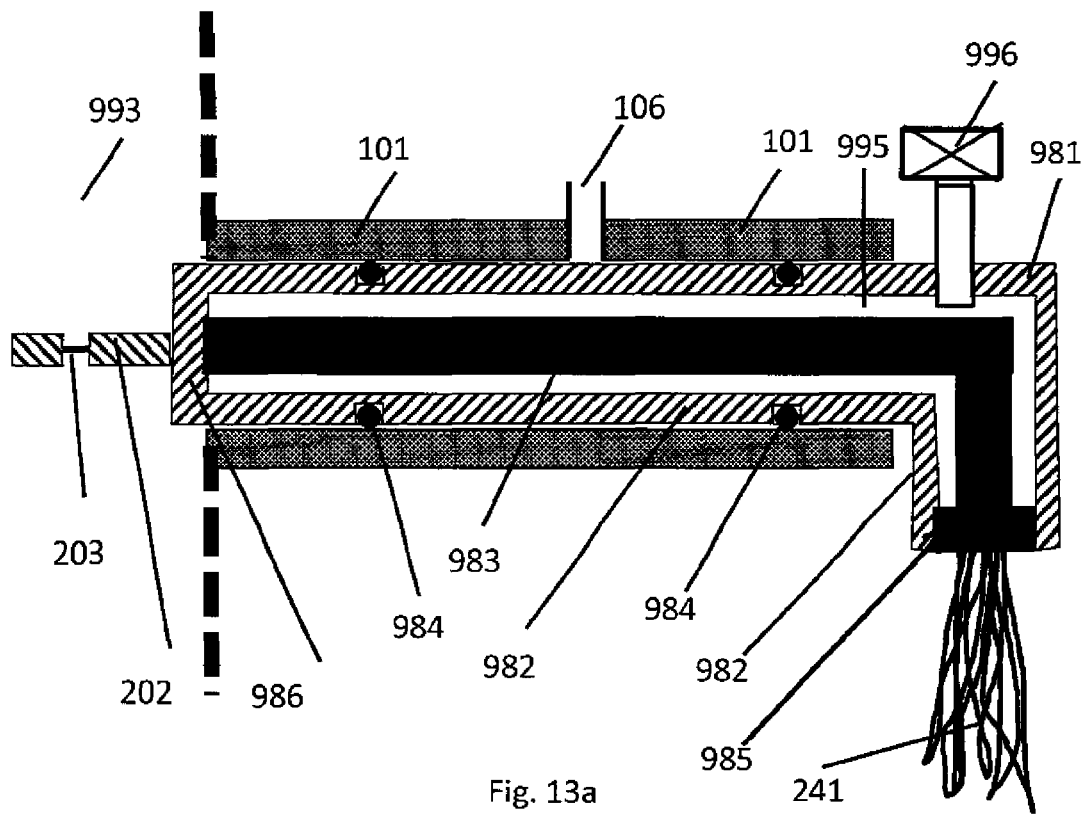
Figure 13B:
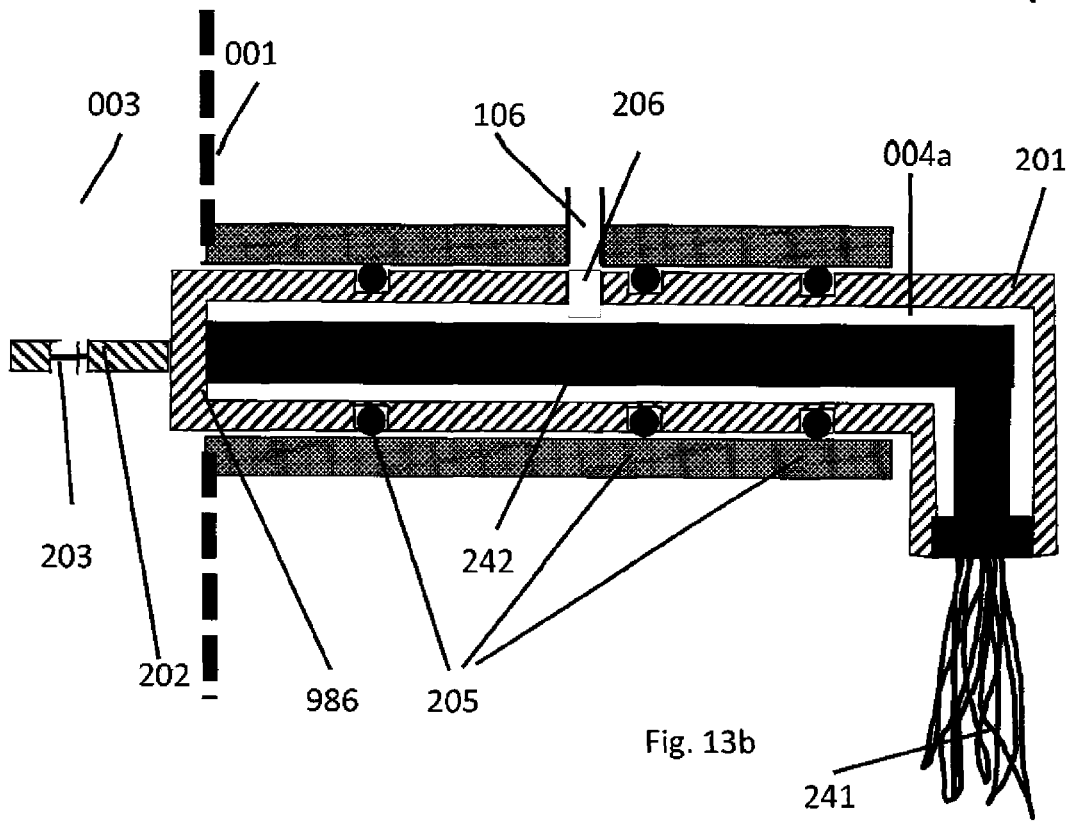

FIG. 13a) shows a prior art system, in which the inside 995 of the cryo transfer holder is pumped using valve 996 prior to the TEM experiment. The O-rings 984 in the outside tube 982 of the sample holder 981 are used to ensure that a good vacuum can be realized in the TEM, once the sample is fully inserted. Prior to insertion of the holder into the TEM the valve 996 is closed and disconnected from the pumping system. Since the inside of the holder is no longer pumped any small leak will lead to a pressure increase, which in case of a not fully vacuum tight connection 986 of the tip 202 to the holder will result in a poorer vacuum 993 in the column. FIG. 13b) shows the situation where the inside of the holder is pumped by the second vacuum system of the TEM through a holder 206 in the outer tube of the holder 201. Since a good vacuum 004a in realized in the inner part of the holder, small vacuum leaks are allows between the inside of the tube and the TEM column, which are often present in case one want to add stimuli such as sample rotation and electrical connections to the sample area.

Figure 14A:
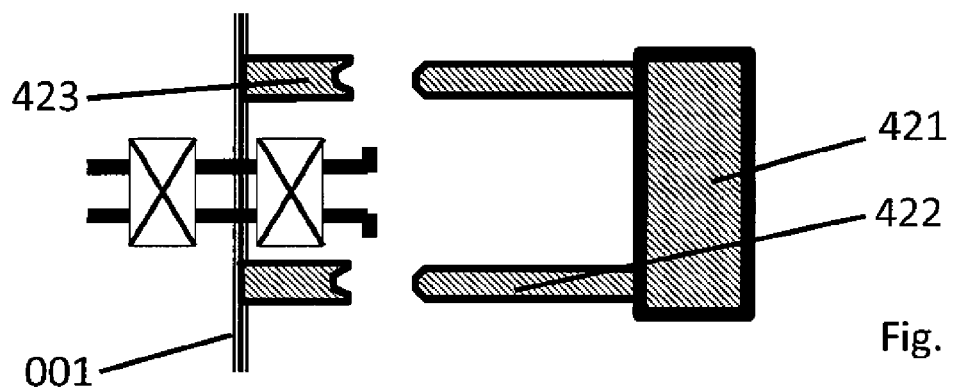
Figure 14B:
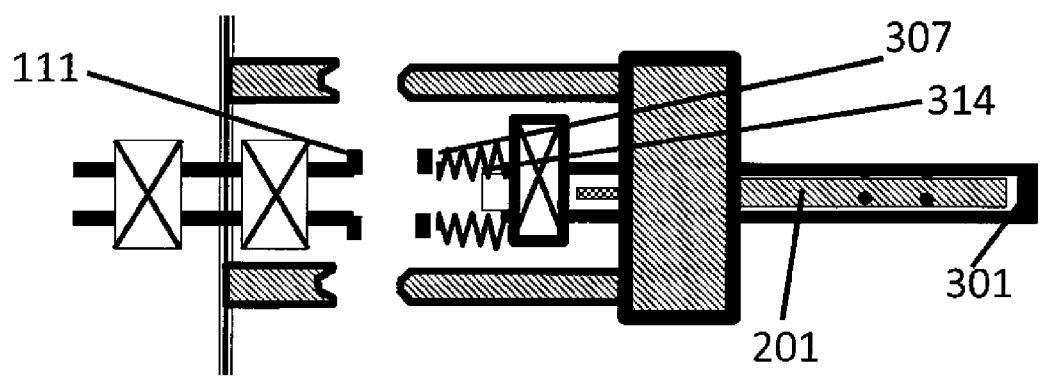
Figure 14C:
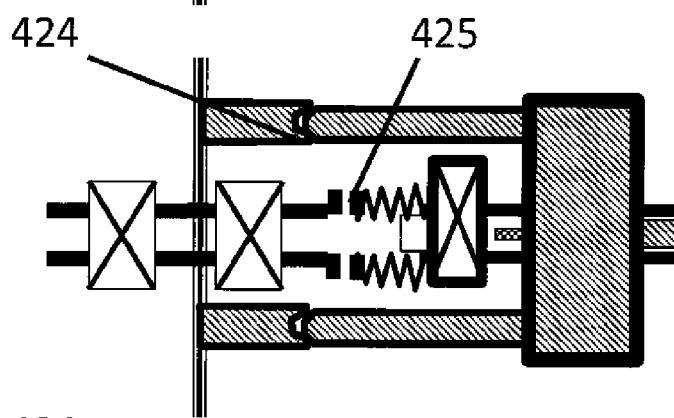
Figure 14D:
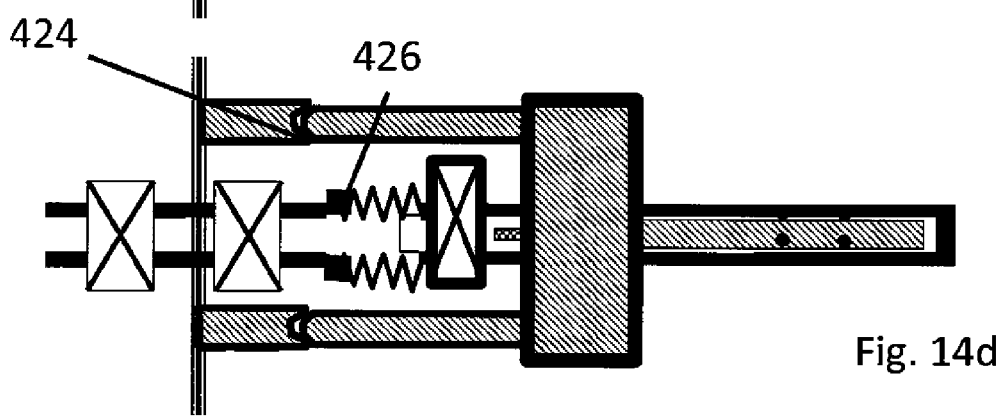

FIGS. 14a,b,c,d show an alternative way of aligning the vacuum transfer. Loading aligner to 312; the right part (as well as the left part) is rigidly connected to the TEM column. The transport container is placed in the right part (connection gives a very precise location of the sample holder with respect to the sample holder stage). Next the right part is moved leftwards to dock in the left part of the loading help. Next the transport container is moved to the left a bit and the connectors are coupled magnetically with an electro-magnet. Next the space of coupling is pumped, after which the magnet can be "shut down". The bellow allows for a small misalignment and coupling to sample holder stage without applying unintended force to the sample holder stage. In relation to the vacuum that can be realized in the TEM column a disadvantage of the side entry sample holder stage is that once the sample is in the TEM, the vacuum in the TEM will be relatively poor because the sample holder was inserted into the sample holder stage through air.

The invention claimed is:
1. A vacuum transfer assembly for use in a microscope, the microscope comprising a port mounted in an outer wall thereof, the port adapted to receive and mount a sample holder stage of the vacuum transfer assembly, the vacuum transfer assembly comprising:
- a sample holder, the sample holder comprising:
  - an outer tube having an outer diameter that is uniform over a major part of a longitudinal axis of the tube;
  - at least three seals provided on the outer tube, wherein each seal has the same diameter spaced apart from one and another, which seals are adapted to act as vacuum seals at various locations; and
  - a sample stage located at a tip of the sample holder;
- a vacuum housing with at least one vacuum housing valve, and a connector with a flange adapted to be connected to the sample holder stage, wherein the sample holder and vacuum housing are adapted to provide sliding of the sample holder into and out of the vacuum housing;
- the sample holder stage for removably attaching to the microscope comprising:
  - a receiving section for receiving the sample holder and incorporated in the receiving section at least two cooperating valves, adapted to restrict a common space between the valves;
  - a stage for moving the sample holder wherein the stage is void of an α-tilter; and
  - a flange, wherein the flange is adapted to receive the flange of the vacuum housing, and wherein the combined flanges comprise at least one seal; and
- a sample holder coupling unit for coupling the sample holder into the sample holder stage, and comprising:
  - a bellow provided in the vacuum housing; and
  - at least one of a fixator for fixating an aligner of the vacuum housing to a microscope column; and
  - a fixator in the sample holder stage that is coupled to its counterpart of the sample holder to fixate the position of the sample holder in the sample holder stage,
- wherein the outer diameter of the outer tube of the sample holder is adapted to fit into an inner diameter of the receiving section of the sample holder stage and of the vacuum housing,
- wherein the at least three seals provided on the outer tube are spaced apart from one and another wherein when inserted into the sample holder stage a first seal is provided preventing gas flow into the microscope, and the second and third seal are adjacent to either side of a second of the two sample holder stage cooperating valves.

2. The assembly according to claim 1, comprising a loading rod in connection with the sample holder.

3. The assembly according to claim 1, wherein at least one of a length of the vacuum housing is larger than a length of the outer tube, the vacuum housing valve is located at a first end of the vacuum housing, and wherein at the other end of the vacuum housing a narrow section is provided comprising a fourth seal, and the narrow section provides passage to an insertion bar.

4. The assembly according to claim 1, wherein the sample holder stage at the receiving flange of the receiving section is provided with a vacuum hood, wherein the vacuum hood is removably attached to a coupling unit or can be rotated away.

5. The assembly according to claim 1, wherein the sample holder comprises at least one of a sample holder recognition element, a cooling rod inside the outer tube, a marker for determining a spatial location of the sample holder with respect to the sample holder stage, an α-tilter and/or β-tilter, and a scale for positioning.

6. The assembly according to claim 1, wherein the sample holder comprises at least one of a multi sample receiver, a sample loader, an electrical connection, and a sensor.

7. The assembly according to claim 1, wherein the sample holder stage comprises at least one of a sample holder aligner incorporated in the receiving section, and an electrical connection for in-situ experiments, a connection for electrically controlling a rotator or α-tilter and/or β-tilter, a rotator, and an α-tilter.

8. The assembly according to claim 1, wherein a length of the vacuum housing is smaller than a length of the outer tube, and wherein a cooling braid is attached to the outer tube.

9. The assembly according to claim 1, wherein at least one of the outer tube of the sample holder has a thickness of >18 mm, a length of 10-60 cm, the vacuum housing has an outer diameter of 22-70 mm, a length of 10-70 cm, wherein the outer tube is made of a light weight metal, wherein the vacuum housing is made of a light weight metal, wherein the seals are made of natural or synthetic rubber, and a motor for controlled movement for the vacuum housing or for the sample holder.

10. The assembly according to claim 1, wherein the sample holder stage comprises at least one of an additional flange and at least one seal in the flange, wherein the flange is adapted to receive the vacuum housing, electrical connections, a sample holder identifier, a lock, and a pumping tube.

11. The assembly according to claim 1, wherein at least a part of the sample holder stage or the vacuum housing that may be exposed to air is coated with a hydrophobic coating.

12. A microscope, selected from a TEM, a SEM, optical microscope, and a FIB, comprising an assembly or assembly part according to claim 1.

13. A method of vacuum transfer, comprising:
providing vacuum transfer assembly for use in a microscope, the microscope comprising a port mounted in an outer wall thereof, the port adapted to receive and mount a sample holder stage of the vacuum transfer assembly, the vacuum transfer assembly comprising:
- a sample holder, comprising:
  - an outer tube having an outer diameter that is uniform over a major part of a longitudinal axis of the tube;
  - at least three seals provided on the outer tube, wherein each seal has the same diameter spaced apart from one and another, which seals are adapted to act as vacuum seals at various locations; and
  - a sample stage located at a tip of the sample holder;
- a vacuum housing with at least one vacuum housing valve, and a connector with a flange adapted to be connected to the sample holder stage, wherein the sample holder and vacuum housing are adapted to provide sliding of the sample holder into and out of the vacuum housing;
- the sample holder stage for removably attaching to the microscope comprising:
  - a receiving section for receiving the sample holder and incorporated in the receiving section at least two cooperating valves, adapted to restrict a common space between the valves;
  - a stage for moving the sample holder wherein the stage is void of an α-tilter; and
  - a flange, wherein the flange is adapted to receive the flange of the vacuum housing, and wherein the combined flanges comprise at least one seal; and
- a sample holder coupling unit for coupling the sample holder into the sample holder stage, and comprising:

a bellow provided in the vacuum housing; and at least one of a fixator for fixating an aligner of the vacuum housing to a microscope column; and a fixator in the sample holder stage that is coupled to its counterpart of the sample holder to fixate the position of the sample holder in the sample holder stage, wherein the outer diameter of the outer tube of the sample holder is adapted to fit into an inner diameter of the receiving section of the sample holder stage and of the vacuum housing;

the method comprising:

bringing a sample under vacuum;

introducing the sample into the sample stage;

transferring the assembly to the microscope;

introducing the sample holder into the microscope; and recognizing the sample holder by the sample holder coupling unit or microscope, wherein the at least three seals provided on the outer tube are spaced apart from one and another wherein when inserted into the sample holder stage a first seal is provided preventing gas flow into the microscope, and the second and third seal are adjacent to either side of a second of the two sample holder stage cooperating valves.

* * * * *